(12) United States Patent
Tanaka

(10) Patent No.: US 7,883,988 B2
(45) Date of Patent: Feb. 8, 2011

(54) METHOD FOR MANUFACTURING SEMICONDUCTOR SUBSTRATE

(75) Inventor: Koichiro Tanaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 71 days.

(21) Appl. No.: 12/469,060

(22) Filed: May 20, 2009

(65) Prior Publication Data

US 2009/0305483 A1 Dec. 10, 2009

(30) Foreign Application Priority Data

Jun. 4, 2008 (JP) .............................. 2008-146914

(51) Int. Cl.
*H01L 21/30* (2006.01)

(52) U.S. Cl. ............... 438/455; 438/458; 257/E21.122; 257/E21.123

(58) Field of Classification Search ......... 438/455–459; 257/E21.122, E21.123
See application file for complete search history.

(56) References Cited

U.S. PATENT DOCUMENTS

| 6,534,380 B1 | 3/2003 | Yamauchi et al. |
| 6,596,610 B1 * | 7/2003 | Kuwabara et al. ........... 438/458 |
| 7,122,448 B2 | 10/2006 | Ito et al. |
| 7,183,229 B2 | 2/2007 | Yamanaka |
| 2007/0148914 A1 * | 6/2007 | Morita et al. ............... 438/458 |

FOREIGN PATENT DOCUMENTS

| JP | 57-064936 | 4/1982 |
| JP | 62-035512 | 2/1987 |
| JP | 05-218367 | 8/1993 |
| JP | 11-097379 | 4/1999 |
| JP | 2000-294754 | 10/2000 |
| JP | 2006-216740 | 8/2006 |

* cited by examiner

*Primary Examiner*—Brook Kebede
(74) *Attorney, Agent, or Firm*—Eric J. Robinson; Robinson Intellectual Property Law Office, P.C.

(57) ABSTRACT

One surface of a single crystal semiconductor substrate is irradiated with ions to form a damaged region in the single crystal semiconductor substrate. An insulating layer is formed over the one surface of the single crystal semiconductor substrate. A surface of a substrate having an insulating surface and a surface of the insulating layer are disposed in contact with each other to bond the substrate having the insulating surface and the single crystal semiconductor substrate to each other. Heat treatment is performed to divide the single crystal semiconductor substrate along the damaged region and to form a semiconductor layer over the substrate having the insulating surface. One surface of the semiconductor layer is irradiated with light from a flash lamp under conditions where the semiconductor layer is not melted, to repair a defect.

28 Claims, 14 Drawing Sheets

FIG. 3A
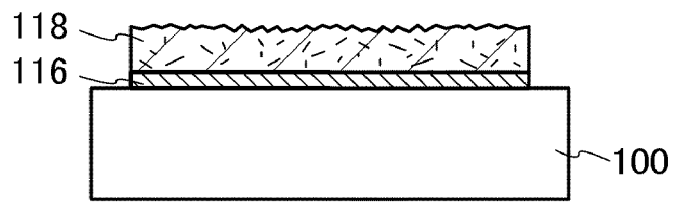
FIG. 3B
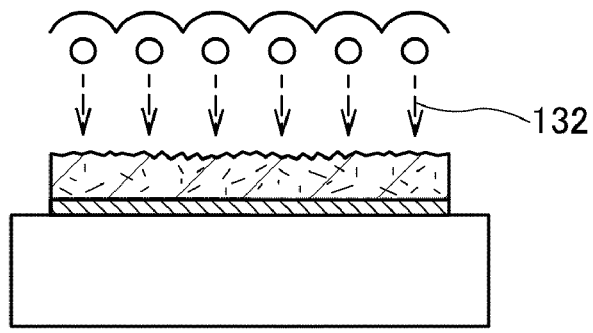
FIG. 3C
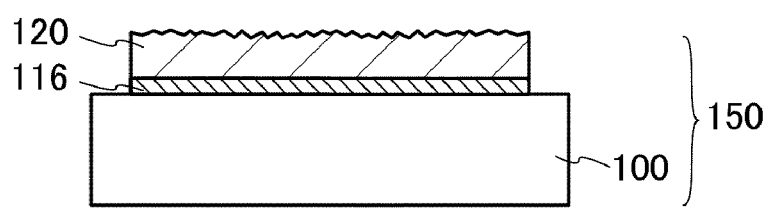
FIG. 3D
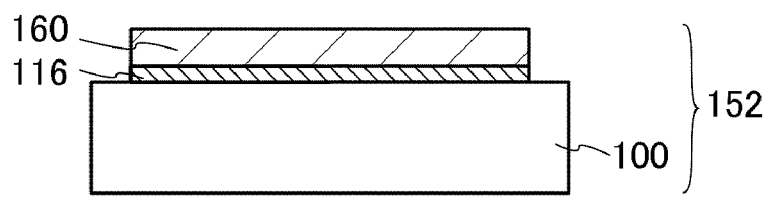

FIG. 4A
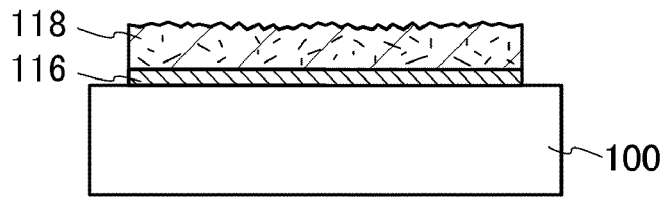
FIG. 4B
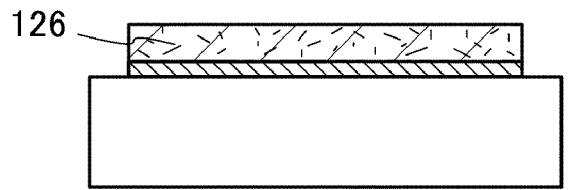
FIG. 4C
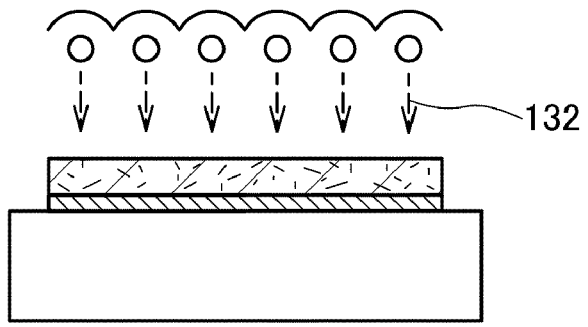
FIG. 4D
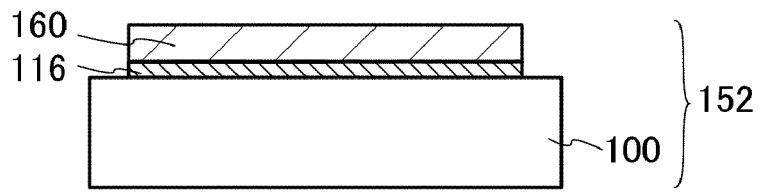

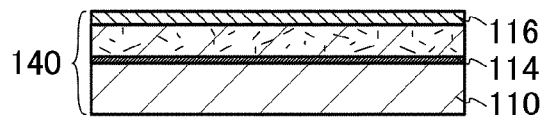
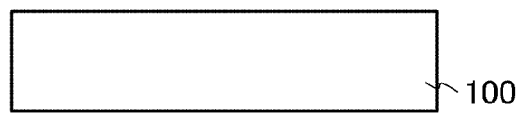
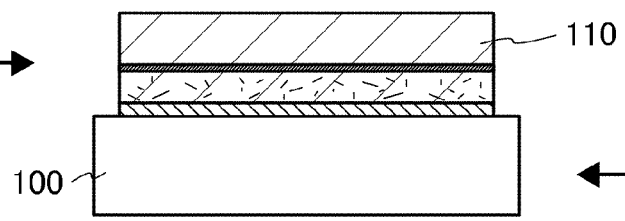
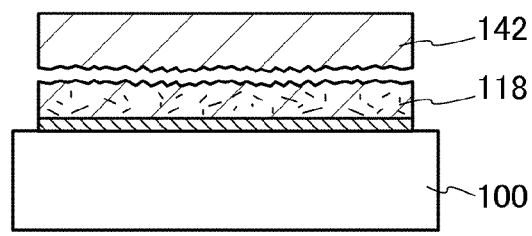
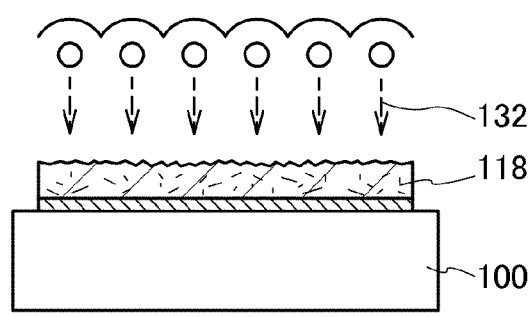

FIG. 6A
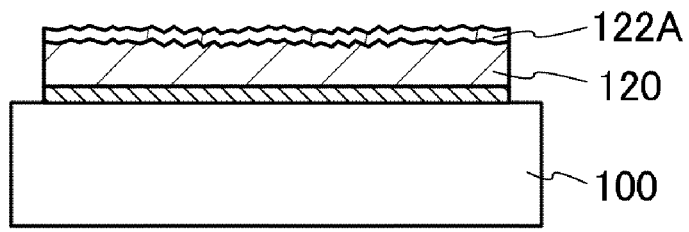
FIG. 6B
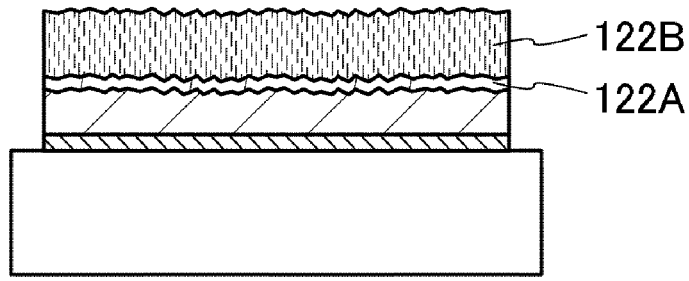
FIG. 6C
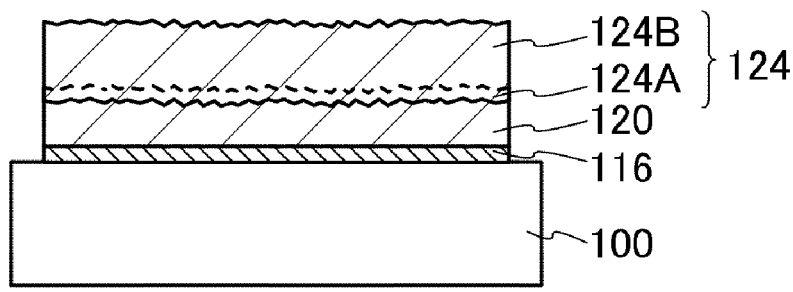

|         | Ra [nm] | P-V [nm] | Rms [nm] |
|---------|---------|----------|----------|
| No.01   | 7.013   | 75.51    | 8.95     |
| No.02   | 6.251   | 61.99    | 7.851    |
| No.03   | 5.78    | 55.13    | 7.285    |
| average | 6.348   | 64.21    | 8.028667 |

METHOD FOR MANUFACTURING SEMICONDUCTOR SUBSTRATE

BACKGROUND OF THE INVENTION

1. Field of the Invention

A technical field of the present invention relates to a method for manufacturing a semiconductor substrate.

2. Description of the Related Art

In recent years, semiconductor devices formed using an SOI (silicon on insulator) substrate, instead of a bulk silicon substrate, have been developed. By utilizing the features of a thin single crystal silicon layer formed over an insulating layer, transistors in a semiconductor device can be completely isolated from each other, and further, fully depleted transistors can be formed. Accordingly, a semiconductor integrated circuit with high added values such as high integration, high speed driving, and low power consumption can be realized.

As a method for manufacturing an SOI substrate, a so-called hydrogen-ion-implantation separation method is known. A typical process of the method will be described below.

First, hydrogen ions are implanted into a silicon substrate to form a damaged region at a predetermined depth from the surface. Next, a silicon oxide film is formed by oxidation of another silicon substrate which serves as a base substrate. After that, the silicon substrate where the damaged region is formed and the silicon oxide film on the other silicon substrate are firmly attached to each other to bond the two silicon substrates. Then, heat treatment is performed, whereby one of the silicon substrates is separated along the damaged region.

In the aforementioned method, a silicon substrate is used as a base substrate, and as its application, there is a known method for forming a single crystal silicon layer over a glass substrate (for example, see Reference 1). Note that in Reference 1, a separation plane is mechanically polished in order to remove a defect formed by ion implantation or a step on the separation plane.

[Reference 1] Japanese Published Patent Application No. H11-097379

SUMMARY OF THE INVENTION

In the case where a single crystal semiconductor layer is formed by using a method in which a single crystal semiconductor substrate is irradiated with ions, the ion irradiation leads to an increase of defects in the single crystal semiconductor layer. In the case where many such defects exist in a single crystal semiconductor layer, a semiconductor element manufactured using this single crystal semiconductor layer has poorer characteristics; for example, defect levels are easily generated at the interface with a gate insulating layer. Further, in the case where many defects exist in a single crystal semiconductor layer, original characteristics of the single crystal semiconductor cannot be obtained.

As a solution to the above problems, for example, recrystallization by heat treatment (heating in thermal equilibrium) can be given. However, heat treatment at a high temperature (e.g., 800° C. or higher) is not appropriate as treatment on a single crystal semiconductor layer formed over a glass substrate. This is because a glass substrate has an issue about allowable temperature limit.

As an alternative method, a method in which a single crystal semiconductor layer is irradiated with laser light is given, for example. By irradiation with laser light, only the single crystal semiconductor layer can be selectively melted, whereby defects can be reduced. As the laser light, pulsed laser light is typically used. The pulsed laser light has the advantage that light intensity that is needed for melting can be obtained more easily than in the case of using continuous-wave laser light.

Here, in the case of irradiating a single crystal semiconductor layer with laser light, there is a problem in that characteristics of the single crystal semiconductor layer are lowered in a region irradiated with an edge portion of the laser light. This is because a melted region and an unmelted region are mixed in that region, and therefore, a distortion is easily generated in a crystal structure at a boundary between the melted region and the unmelted region. Then, as a result of generation of such a distortion, a protruding object (projection) is created on the surface of the semiconductor layer and a crystal grain boundary is formed. As a method for solving this problem, enlargement of a laser light irradiation area can be considered so as to be able to melt a whole area of a single crystal semiconductor layer, for example. However, it is very difficult to obtain laser light having a light intensity that enables a large-area semiconductor layer to be uniformly melted.

In view of the foregoing problems, an object of an embodiment of the invention disclosed in this specification and the like (including at least the specification, the claims, and the drawings) is to improve characteristics of a semiconductor layer without lowering productivity of a semiconductor substrate. Another object is to suppress in-plane variation of a semiconductor layer and to obtain a semiconductor layer having uniform characteristics.

In one embodiment of the disclosed invention, a surface of a semiconductor layer is irradiated with light from a flash lamp to repair defects in the semiconductor layer. In that case, the semiconductor layer is not melted (or the planarity of the surface of the semiconductor layer is not changed). The time of irradiation with the light from the flash lamp (pulse width) is 10 μs or more (preferably 10 μs to 100 ms, more preferably 100 μs to 10 ms). The light from the flash lamp is preferably light having a continuous spectrum in a visible light region (at least from 400 nm to 700 nm), that is, white light.

A feature of one method for manufacturing a semiconductor substrate which is one embodiment of the disclosed invention is as follows. One surface of a single crystal semiconductor substrate is irradiated with ions to form a damaged region in the single crystal semiconductor substrate. An insulating layer is formed over the one surface of the single crystal semiconductor substrate. A surface of a substrate having an insulating surface and a surface of the insulating layer are disposed in contact with each other to bond the substrate having the insulating surface and the single crystal semiconductor substrate to each other. Heat treatment is performed to divide the single crystal semiconductor substrate along the damaged region and to form a semiconductor layer over the substrate having the insulating surface. One surface of the semiconductor layer is irradiated with light from a flash lamp under conditions where the semiconductor layer is not melted, to repair a defect.

A feature of another method for manufacturing a semiconductor substrate which is one embodiment of the disclosed invention is as follows. One surface of a single crystal semiconductor substrate is irradiated with ions to form a damaged region in the single crystal semiconductor substrate. A first insulating layer is formed over the one surface of the single crystal semiconductor substrate. A second insulating layer is formed over one surface of a substrate having an insulating surface. A surface of the second insulating layer and a surface of the first insulating layer are disposed in contact with each other to bond the substrate having the insulating surface and the single crystal semiconductor substrate to each other. Heat treatment is performed to divide the single crystal semiconductor substrate along the damaged region and to form a semiconductor layer over the substrate having the insulating surface. One surface of the semiconductor layer is irradiated with light from a flash lamp under conditions where the semiconductor layer is not melted, to repair a defect.

A feature of another method for manufacturing a semiconductor substrate which is one embodiment of the disclosed invention is as follows. An insulating layer is formed over one surface of a single crystal semiconductor substrate. One surface of the insulating layer is irradiated with ions to form a damaged region in the single crystal semiconductor substrate. A surface of a substrate having an insulating surface and the surface of the insulating layer are disposed in contact with each other to bond the substrate having the insulating surface and the single crystal semiconductor substrate to each other. Heat treatment is performed to divide the single crystal semiconductor substrate along the damaged region and to form a semiconductor layer over the substrate having the insulating surface. One surface of the semiconductor layer is irradiated with light from a flash lamp under conditions where the semiconductor layer is not melted, to repair a defect.

A feature of another method for manufacturing a semiconductor substrate which is one embodiment of the disclosed invention is as follows. A first insulating layer is formed over one surface of a single crystal semiconductor substrate. One surface of the first insulating layer is irradiated with ions to form a damaged region in the single crystal semiconductor substrate. A second insulating layer is formed over one surface of a substrate having an insulating surface. A surface of the second insulating layer and the surface of the first insulating layer are disposed in contact with each other to bond the substrate having the insulating surface and the single crystal semiconductor substrate to each other. Heat treatment is performed to divide the single crystal semiconductor substrate along the damaged region and to form a semiconductor layer over the substrate having the insulating surface. One surface of the semiconductor layer is irradiated with light from a flash lamp under conditions where the semiconductor layer is not melted, to repair a defect.

In the above description, the expression "conditions where the semiconductor layer is not melted" refers to conditions where volume movement resulting from melting does not occur, but the expression does not exclude conditions where instantaneous melting occurs while volume movement does not occur, conditions where microscopic bond rearrangement occurs, and the like. In this sense, the above expression "under conditions where the semiconductor layer is not melted" can be replaced with the expression "under conditions where the planarity of the surface of the semiconductor layer is not changed." In other words, the intensity of the light from the flash lamp may be controlled such that the unevenness of the surface of the semiconductor layer does not change.

Note that in the above methods, planarization treatment is preferably performed on the semiconductor layer before or after the irradiation with the light from the flash lamp. Here, etching treatment can be employed as the planarization treatment. Alternatively, laser light irradiation treatment may be employed unless it causes a variation in characteristics.

In the above methods, the time of irradiation with the light from the flash lamp is preferably 10 μs or more. In addition, the light from the flash lamp preferably has a continuous spectrum in a wavelength range from 400 nm to 700 nm. As such a flash lamp, a xenon lamp can be used, for example.

Note that in the above methods, during the irradiation with the light from the flash lamp, the temperature of the substrate having the insulating surface is preferably kept at 300° C. or higher.

In one embodiment of the disclosed invention, light from a flash lamp (hereinafter also referred to as flash lamp light) is used to repair defects of a semiconductor layer without melting the semiconductor layer. Thus, compared to the case of using laser light and melting a semiconductor layer, productivity can be drastically improved. In addition, since a semiconductor layer is not melted, a crystal grain boundary and the like resulting from generation of a melted region and an unmelted region are not produced. Thus, in-plane variation of a semiconductor layer can be reduced, and a semiconductor layer having favorable and uniform characteristics can be obtained. Furthermore, compared to heating in thermal equilibrium with a furnace or the like, treatment can be efficiently performed in an extremely short time. That is, a large-area substrate having favorable and uniform characteristics can be provided extremely efficiently. Note that when a semiconductor layer is irradiated with laser light to improve its characteristics, linear pulsed laser light having a beam spot of about 0.5 mm×300 mm is normally used. This is because light intensity sufficient for partial melting of the semiconductor layer is needed. On the other hand, in the present invention, flash lamp light enables a large area to be treated at a time.

Note that a semiconductor layer having favorable characteristics can be formed without being melted because a semiconductor layer which is separated from a single crystal semiconductor substrate (which may be hereinafter referred to as a "quasi-single-crystal semiconductor layer" for convenience) is used as the semiconductor layer. A semiconductor layer which is separated from a single crystal semiconductor substrate (a quasi-single-crystal semiconductor layer) has a basic structure similar to that of a single crystal semiconductor layer and differs from a single crystal semiconductor layer simply by the presence of a large number of defects. In other words, if defects can be effectively repaired, extremely high characteristics like those of a single crystal semiconductor can also be obtained in the case of using a non-melt defect repair process.

Note that in a process which requires melting of a semiconductor layer, such as in the case of laser light irradiation, there is a problem in that the range of optimal power densities is narrow. On the other hand, in one embodiment of the disclosed invention, melting of a semiconductor layer is not needed; thus, the range of optimal power densities is broad and that is extremely advantageous in a manufacturing process of a semiconductor substrate.

BRIEF DESCRIPTION OF THE DRAWINGS

FIGS. 3A to 3D are diagrams illustrating a method for manufacturing a semiconductor substrate.

FIGS. 4A to 4D are diagrams illustrating a method for manufacturing a semiconductor substrate.

FIGS. 5A to 5E are diagrams illustrating a method for manufacturing a semiconductor substrate.

FIGS. 6A to 6C are diagrams illustrating a method for manufacturing a semiconductor substrate.

DETAILED DESCRIPTION OF THE INVENTION

Figure 1A:
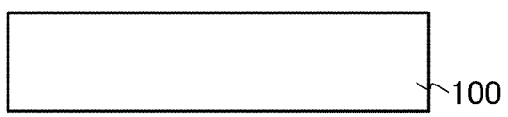
FIGS. 1A to 1F are diagrams illustrating a method for manufacturing a semiconductor substrate.

Embodiments will be hereinafter described in detail with reference to the attached drawings. Note that the present invention is not limited to the description in Embodiments given below, and it is easily understood by those skilled in the art that the mode and details of the invention disclosed in this specification and the like can be changed in various ways without deviating from the spirit of the invention. In addition, structures in different embodiments can be implemented in combination as appropriate. Note that the same portions or portions having a similar function are denoted by the same reference numerals, and repetitive description thereof is omitted. In addition, the semiconductor device in this specification refers to all devices that operate by utilizing semiconductor characteristics.

Embodiment 1

In Embodiment 1, a method for manufacturing a semiconductor substrate which is one embodiment of the disclosed invention will be described with reference to FIGS. 1A to 1F and FIGS. 2A to 2C.

First, a base substrate 100 is prepared (see FIG. 1A). As the base substrate 100, a substrate having an insulating surface, such as a visible light transmitting glass substrate used for a liquid crystal display device or the like, can be used, for example. As a glass substrate, a substrate having a strain point of 580° C. or higher (preferably, 600° C. or higher) may be used. Further, it is preferable that the glass substrate be a non-alkali glass substrate. As a material of the non-alkali glass substrate, a glass material such as aluminosilicate glass, aluminoborosilicate glass, or barium borosilicate glass is used, for example.

Note that as the base substrate 100, as well as a glass substrate, a substrate having an insulating surface, such as a ceramic substrate, a quartz substrate, or a sapphire substrate, a substrate which is formed from a semiconductor material such as silicon, a substrate which is formed from a conductor such as metal or stainless steel, or the like can also be used.

Although not described in this embodiment, an insulating layer may be formed over a surface of the base substrate 100. By providing the insulating layer, even in the case where impurities (such as an alkali metal or an alkaline earth metal) are included in the base substrate 100, the impurities can be prevented from being diffused into a semiconductor layer. The insulating layer may have either a single-layer structure or a stacked structure. As a material of the insulating layer, silicon oxide, silicon nitride, silicon oxynitride, silicon nitride oxide, aluminum oxide, aluminum nitride, aluminum oxynitride, aluminum nitride oxide, or the like can be given.

Note that in this specification and the like, an oxynitride refers to a substance that contains more oxygen (atoms) than nitrogen (atoms). For example, a silicon oxynitride is a substance including oxygen, nitrogen, silicon, and hydrogen in ranges of 50 at. % to 70 at. %, 0.5 at. % to 15 at. %, 25 at. % to 35 at. %, and 0.1 at. % to 10 at. %, respectively. A nitride oxide refers to a substance that contains more nitrogen (atoms) than oxygen (atoms). For example, a silicon nitride oxide is a substance including oxygen, nitrogen, silicon, and hydrogen in ranges of 5 at. % to 30 at. %, 20 at. % to 55 at. %, 25 at. % to 35 at. %, and 10 at. % to 25 at. %, respectively. Note that the above-mentioned ranges are obtained by measurement using Rutherford backscattering spectrometry (RBS) or hydrogen forward scattering (HFS). Moreover, the total of the percentages of the constituent elements does not exceed 100 at. %.

Figure 1B:
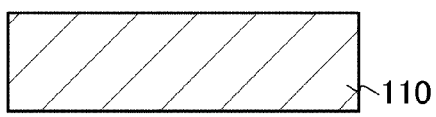

Next, a single crystal semiconductor substrate 110 is prepared (see FIG. 1B). As the single crystal semiconductor substrate 110, for example, a semiconductor substrate formed from an element belonging to Group 4 of the periodic table, such as silicon, germanium, silicon-germanium, or silicon carbide, can be used. Needless to say, a substrate formed from a compound semiconductor such as gallium arsenide or indium phosphide may be used. In this embodiment, as the single crystal semiconductor substrate 110, a single crystal silicon substrate is used. Although there is no limitation on the size and the shape of the single crystal semiconductor substrate 110, a circular semiconductor substrate of 8 inches (200 mm) in diameter, 12 inches (300 mm) in diameter, 18 inches (450 mm) in diameter, or the like, for example, may be processed into a rectangular shape and the processed substrate may be used. A semiconductor substrate of more than 20 inches can also be used in some applications. In this specification, the term "single crystal" means a crystal which has a crystal structure with certain regularity and in which crystal axes are aligned in the same direction in any part of the crystal.

After the single crystal semiconductor substrate 110 is cleaned, an insulating layer 112 is formed over a surface of the single crystal semiconductor substrate 110. The insulating layer 112 is not necessarily needed. However, it is preferable to provide the insulating layer 112 in order to prevent contamination of the single crystal semiconductor substrate 110, damage to the surface of the single crystal semiconductor substrate 110, etching of the surface of the single crystal semiconductor substrate 110, and the like due to later ion irradiation. The thickness of the insulating layer 112 may be approximately 1 nm to 400 nm.

As a material of the insulating layer 112, an insulating material containing silicon or germanium as a component, such as silicon oxide, silicon nitride, silicon oxynitride, silicon nitride oxide, germanium oxide, germanium nitride, germanium oxynitride, or germanium nitride oxide, can be used. Further, a metal oxide such as aluminum oxide, tantalum oxide, or hafnium oxide, a metal nitride such as aluminum nitride, a metal oxynitride such as aluminum oxynitride, or a metal nitride oxide such as aluminum nitride oxide may also be used. The insulating layer 112 can be formed by a CVD method, a sputtering method, a method using oxidation (or nitridation) of the single crystal semiconductor substrate 110, or the like.

Figure 1C:
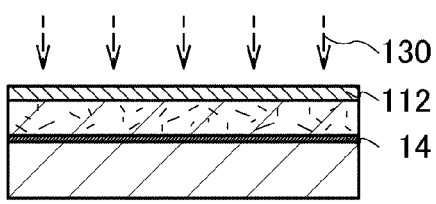

Next, the single crystal semiconductor substrate 110 is irradiated with an ion beam 130 including ions accelerated by an electric field through the insulating layer 112, so that a damaged region 114 is formed in the single crystal semiconductor substrate 110 in a region at a predetermined depth from the surface thereof (see FIG. 1C). The depth at which the damaged region 114 is formed can be controlled by acceleration energy and incident angle of the ion beam 130. The damaged region 114 is formed in a region at a depth equal to or substantially equal to the average penetration depth of the ions.

The thickness of a semiconductor layer which is separated from the single crystal semiconductor substrate 110 is determined by the depth at which the damaged region 114 is formed. The depth at which the damaged region 114 is formed is 20 nm to 500 nm, preferably 30 nm to 200 nm, from the surface of the single crystal semiconductor substrate 110.

When the single crystal semiconductor substrate 110 is irradiated with ions, an ion implantation apparatus or an ion doping apparatus can be used. In an ion implantation apparatus, a source gas is excited to produce ions, the produced ions are mass-separated, and a process object is irradiated with ions having a predetermined mass. In an ion doping apparatus, a process gas is excited to produce ions, and a process object is irradiated with the produced ions without mass separation. Note that in an ion doping apparatus provided with a mass separator, ion irradiation involving mass separation can also be performed as in an ion implantation apparatus.

The ion irradiation step in the case of using an ion doping apparatus can be performed under conditions, for example, at an acceleration voltage of 5 kV to 100 kV (preferably 30 kV to 80 kV), with a dose of $6\times10^{15}$ ions/cm$^2$ to $4\times10^{16}$ ions/cm$^2$, and with a beam current density of 2 μA/cm$^2$ or more (preferably 5 μA/cm$^2$ or more, more preferably 10 μA/cm$^2$ or more).

In the case of using an ion doping apparatus, a gas containing hydrogen can be used as a source gas for the ion irradiation step. With the gas containing hydrogen, $H^+$, $H_2^+$, and $H_3^+$ can be produced as ions. In the case where the gas containing hydrogen is used as a source gas, it is preferable to perform irradiation with a large number of $H_3^+$. Specifically, the proportion of $H_3^+$ with respect to the total amount of $H^+$, $H_2^+$, and $H_3^+$ in the ion beam 130 is set to 70% or higher (preferably 80% or higher). By increasing the proportion of $H_3^+$ in this manner, the damaged region 114 can be made to contain hydrogen at a concentration of $1\times10^{20}$ atoms/cm$^3$ or more. An increase in the proportion of $H_3^+$ and local inclusion of a large number of ions in the damaged region 114 facilitate division along the damaged region 114. In addition, by irradiation with a large number of $H_3^+$, ion irradiation efficiency is improved compared to the case of irradiation with $H^+$ or $H_2^+$. That is, the time needed for the irradiation can be shortened.

In the case of using an ion implantation apparatus, it is preferable to perform irradiation with $H_3^+$ through mass separation. Of course, irradiation with $H^+$ or $H_2^+$ may be performed. Note that in the case of using an ion implantation apparatus, ion irradiation efficiency may be lower than in the case of using an ion doping apparatus because irradiation is performed with selected ions.

As a source gas used for the ion irradiation step, as well as a gas containing hydrogen, one or more kinds of gases selected from noble gases such as helium and argon, halogen gases typified by a fluorine gas and a chlorine gas, and halogen compound gases such as a fluorine compound gas (e.g., $BF_3$) can be used. In the case where helium is used as a source gas, the ion beam 130 with a high proportion of $He^+$ ions can be produced without mass separation. By using that ion beam 130, the damaged region 114 can be efficiently formed.

Further, the damaged region 114 can also be formed by performing the ion irradiation step plural times. In this case, a different source gas may be used for each of the ion irradiation steps or the same source gas may be used for the ion irradiation steps. For example, ion irradiation can be performed using a gas containing hydrogen as a source gas after ion irradiation is performed using a noble gas as a source gas. Alternatively, ion irradiation can be performed using a halogen gas or a halogen compound gas, and then, ion irradiation can be performed using a gas containing hydrogen.

Figure 1D:
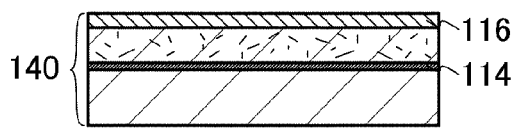

After the damaged region 114 is formed, the insulating layer 112 is removed and an insulating layer 116 is newly formed (see FIG. 1D). Here, the insulating layer 112 is removed because there is a high possibility that the insulating layer 112 may be damaged in the ion irradiation step. If damage of the insulating layer 112 does not cause any problems, it is not necessary to remove the insulating layer 112. In this case, the insulating layer 116 may be newly formed over the insulating layer 112, or a structure in which the insulating layer 116 is not formed may be employed.

As a material of the insulating layer 116, an insulating material containing silicon or germanium as a component, such as silicon oxide, silicon nitride, silicon oxynitride, silicon nitride oxide, germanium oxide, germanium nitride, germanium oxynitride, or germanium nitride oxide, can be used. Further, a metal oxide such as aluminum oxide, tantalum oxide, or hafnium oxide, a metal nitride such as aluminum nitride, a metal oxynitride such as aluminum oxynitride, or a metal nitride oxide such as aluminum nitride oxide may also be used. As a method for forming the insulating layer 116, a CVD method, a sputtering method, a method using oxidation (or nitridation) of the single crystal semiconductor substrate 110, or the like can be given. Note that the insulating layer 116 has a single-layer structure in this embodiment; however, one embodiment of the disclosed invention is not interpreted as being limited thereto. The insulating layer 116 can have a stacked structure of two or more layers.

Since the insulating layer 116 is a layer for bonding, the surface thereof preferably has high planarity. For example, a layer with a surface having an arithmetic mean roughness of 0.6 nm or less (preferably 0.3 nm or less) and a root-mean-square roughness of 0.7 nm or less (preferably 0.4 nm or less) is formed. As such an insulating layer 116, a silicon oxide film formed by a chemical vapor deposition method using an organosilane gas can be used, for example. Note that the structure illustrated in FIG 1D is hereinafter referred to as a substrate 140 for convenience.

Figure 1E:
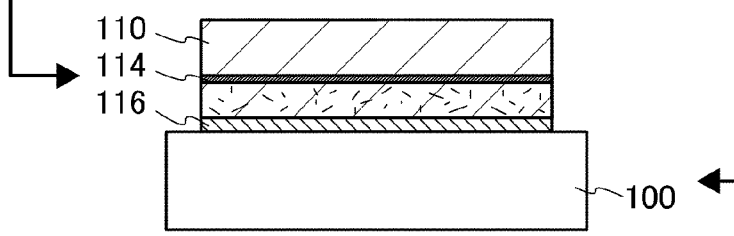

Then, the base substrate 100 and the substrate 140 are bonded to each other (see FIG. 1E). Specifically, surfaces of the base substrate 100 and the substrate 140 (the insulating layer 116) are cleaned by a method such as ultrasonic cleaning (including so-called megasonic cleaning with a frequency of 50 kHz to 5 MHz) and subjected to treatment using a chemical solution which provides hydrophilic groups (such as ozone water, a mixture of ammonium water and a hydrogen peroxide solution (and water), or another oxidizing agent). Then, the surfaces of the base substrate 100 and the substrate 140 are disposed in contact with each other and pressure is applied thereto. As treatment performed on the surfaces of the base substrate 100 and the substrate 140, as well as the treatment using a chemical solution, oxygen plasma treatment can be given, for example.

Since it is considered that bonding involves van der Waals' force, hydrogen bonding, or the like, a method which can make the best of these principles is preferably used. For example, before bonding, the surfaces of the base substrate 100 and the substrate 140 are preferably made hydrophilic by being subjected to treatment with a chemical solution which provides hydrophilic groups or oxygen plasma treatment as mentioned above. By this treatment, hydrophilic groups are provided to the surfaces of the base substrate 100 and the substrate 140; accordingly, many hydrogen bonds can be formed at the bonding interface. That is, bonding strength can be increased.

The atmosphere at the time of bonding can be an air atmosphere, an inert atmosphere such as a nitrogen atmosphere, an atmosphere containing oxygen or ozone, or a reduced-pressure atmosphere. By performing bonding in the inert atmosphere or the atmosphere containing oxygen or ozone, the hydrophilic groups provided to the surfaces of the base substrate 100 and the substrate 140 can be effectively utilized for bonding. Alternatively, bonding can be performed in a reduced-pressure atmosphere. In this case, since the effect of contaminants in the atmosphere can be made small, the bonding interface can be kept clean. In addition, trapping of air between the substrates in bonding can be reduced.

In this embodiment, the process of forming a semiconductor layer by bonding one substrate 140 to one base substrate 100 is described; however, one embodiment of the disclosed invention is not limited thereto. For example, a plurality of semiconductor layers may be formed by bonding a plurality of substrates 140 to one base substrate 100.

Next, heat treatment is performed on the base substrate 100 and the substrate 140 which have been bonded to each other, to strengthen the bond. The heat treatment is performed as immediately as possible after the bonding. This is because, in the case where the substrates are transported after the bonding and before the heat treatment, there is a high possibility that the substrate 140 may be detached due to a sag of the base substrate 100.

The temperature of the above heat treatment needs to be a temperature which is equal to or lower than an allowable temperature limit of the base substrate and does not cause division in the substrate 140 (division along the damaged region 114). For example, the temperature can be 150° C. to 450° C., preferably 200° C. to 400° C. The treatment time is preferably 1 minute to 10 hours (more preferably 3 minutes to 3 hours), but optimal conditions can be appropriately determined from the relationship between the treatment speed and the bonding strength. In this embodiment, the heat treatment is performed at 200° C. for two hours. Alternatively, heating can be locally performed by irradiating only a region of the substrates, at which bonding is performed, with microwaves.

Figure 1F:
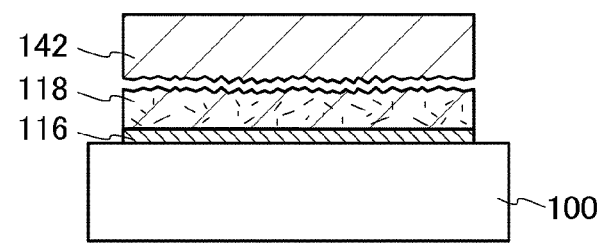

Next, the substrate 140 is divided into a single crystal semiconductor substrate 142, and the insulating layer 116 and a semiconductor layer 118 (see FIG. 1F). Division of the substrate 140 is conducted by heat treatment. The temperature of the heat treatment can be set in consideration of the allowable temperature limit of the base substrate 100. For example, when a glass substrate is used as the base substrate 100, the temperature of the heat treatment is preferably 400° C. to 650° C. Note that the upper limit of the temperature of the heat treatment can be appropriately set depending on heat resistance of the base substrate 100. For example, if the base substrate 100 is resistant to heat treatment at temperatures up to 750° C., the heat treatment may be performed at a temperature of 750° C. or lower. Note that in this embodiment, the heat treatment is performed at 600° C. for two hours.

By the above-described heat treatment, the volume of microvoids formed in the damaged region 114 is changed, whereby a crack is generated in the damaged region 114. As a result, the single crystal semiconductor substrate 110 is divided along the damaged region 114. Since the insulating layer 116 is bonded to the base substrate 100, the semiconductor layer 118 separated from the single crystal semiconductor substrate 110 remains over the base substrate 100. Further, since the bonding interface between the base substrate 100 and the insulating layer 116 is heated by this heat treatment, a covalent bond is formed at the bonding interface so that the bonding force between the base substrate 100 and the insulating layer 116 is further improved. The single crystal semiconductor substrate 142 can be utilized again after the surface thereof is planarized.

Figure 2A:
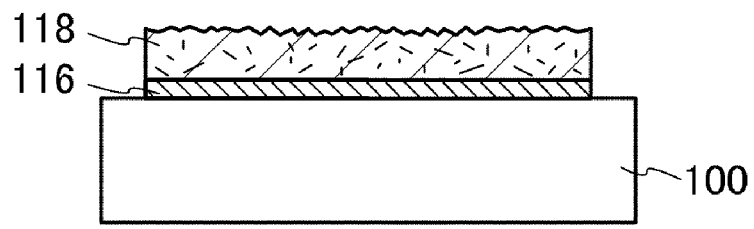
FIGS. 2A to 2C are diagrams illustrating a method for manufacturing a semiconductor substrate.

In the above-described manner, a semiconductor substrate including the semiconductor layer 118 over the base substrate 100 is formed (see FIG. 2A). The semiconductor substrate has a structure where the insulating layer 116 and the semiconductor layer 118 are sequentially stacked over the base substrate 100.

Defects due to the ion irradiation step or the division step exist in the semiconductor layer 118 formed as described above. If the semiconductor layer 118 has many defects, characteristics as a single crystal semiconductor cannot be exhibited, and performance and reliability of a semiconductor element are adversely affected; for example, the localized state density at the interface between the semiconductor layer 118 and the gate insulating layer is increased. Therefore, defect reduction treatment is performed on the semiconductor layer 118.

In this embodiment, defect reduction in the semiconductor layer 118 is achieved by irradiating the semiconductor layer 118 with flash lamp light 132. More specifically, a whole area of the semiconductor layer 118 is irradiated with the flash lamp light 132 (see FIG. 2B). In that case, the light intensity of the flash lamp light is set such that the semiconductor layer 118 is not melted (or such that the planarity of the surface of the semiconductor layer is not changed). For example, when the semiconductor layer 118 has a thickness of about 100 nm, the light intensity of the flash lamp light may be set to about 0.1 J/cm$^2$ to 300 J/cm$^2$ (preferably 1 J/cm$^2$ to 30 J/cm$^2$). Note that the optimal light intensity of the flash lamp light varies depending on the thickness of the semiconductor layer 118 or the like; thus, there is no need for the light intensity to be interpreted as being limited to the range given here. The time of irradiation with the flash lamp light (pulse width) is 10 μs or more (preferably 10 μs to 100 ms, more preferably 100 μs to 10 ms). During the irradiation with the flash lamp light 132, the temperature of the base substrate 100 is preferably kept at 300° C. or higher (more preferably 500° C. or higher). Accordingly, defect repair can be performed effectively.

Note that an example of irradiating the semiconductor layer 118 with the flash lamp light 132 from above (from the side opposite to the base substrate side) is described in this embodiment; however, the present invention is not limited to this example. The semiconductor layer 118 can also be irradiated from below (from the base substrate side). In this case, the semiconductor layer 118 is irradiated with the flash lamp light 132 which is transmitted through the base substrate 100 and the like. Alternatively, the semiconductor layer 118 may be irradiated with the flash lamp light 132 from both above and below. When the semiconductor layer 118 is irradiated with the flash lamp light 132 from above and below, defect repair can be achieved further effectively. Note that the semiconductor layer 118 has a predetermined surface unevenness (with an Ra (arithmetic mean roughness) of about 5 nm to 50 nm) due to the ion irradiation step or the division step. Therefore, when the semiconductor layer 118 is irradiated with the flash lamp light 132 from above, reflection at the surface of the semiconductor layer 118 can be suppressed due to an anti-reflection effect of the above-mentioned unevenness, and effective defect repair can be performed. Note that in order to improve the efficiency of irradiation with the flash lamp light 132, the ion irradiation step, the division step, or the like may be intentionally performed under conditions where surface unevenness is increased.

The flash lamp light 132 is preferably light having a continuous spectrum in a visible light region (at least from 400 nm to 700 nm), that is, white light. With the use of flash lamp light as mentioned above, the flash lamp light 132 can penetrate to a sufficient depth even when the semiconductor layer 118 is thick. That is, defect repair can be favorably performed.

Note that the irradiation with the flash lamp light 132 is preferably performed in, but not limited to, a vacuum or a reduced-pressure atmosphere. In the case of irradiation with the flash lamp light 132, unlike in the case of irradiation with laser light, the semiconductor layer 118 is not melted. Therefore, a problem of surface oxidation or the like is not so serious as in the case of using laser light, and a sufficiently favorable semiconductor layer can also be obtained in the case of an atmosphere other than a vacuum or a reduced-pressure atmosphere. Also in this regard, it can be said that a method using the flash lamp light 132 has an advantage over a method using laser light.

Needless to say, the irradiation with the flash lamp light 132 may be performed in the air atmosphere or other atmospheres. For example, the irradiation with the flash lamp light 132 can be performed in an inert atmosphere such as nitrogen or argon. In order to perform the irradiation with the flash lamp light 132 in an inert atmosphere, the irradiation with the flash lamp light 132 may be performed in an airtight chamber, and the atmosphere in this chamber may be controlled.

Figure 2B:
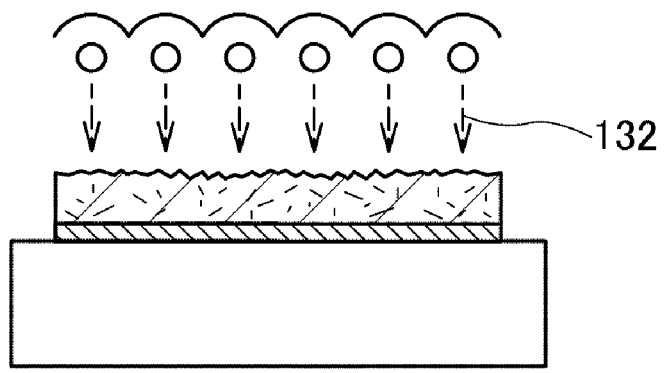

There is no particular limitation on a flash lamp that is a light source of the flash lamp light; for example, a xenon lamp, a halogen lamp, a high pressure UV lamp, an ultra high pressure UV lamp, or the like can be used. In particular, it can be said that a xenon lamp (a xenon flash lamp) is extremely suitable for the present invention because it can easily emit light repeatedly with high light intensity. Although FIG. 2B illustrates an example in which a plurality of flash lamps are disposed parallel and are each provided with a reflector plate, the disposition and structure of flash lamps (and reflector plates) are not limited to this example. For example, a plurality of flash lamps may be disposed parallel and one or more large-sized reflector plates may be then disposed above (or below) the flash lamps so that the efficiency of irradiation with flash lamp light can be improved. The number and size of flash lamps can also be appropriately set.

Note that the time of irradiation with the flash lamp light is sufficiently shorter than that of normal lamp light. For example, the time of irradiation with the flash lamp light (pulse width) is, for example, 10 μs to 100 ms (preferably 100 μs to 10 ms), whereas the time of irradiation with normal lamp light is approximately 0.5 s or longer. Due to this difference in irradiation time, an extremely favorable semiconductor substrate can be obtained in one embodiment of the disclosed invention as compared to the case of irradiation with lamp light.

Figure 14A:
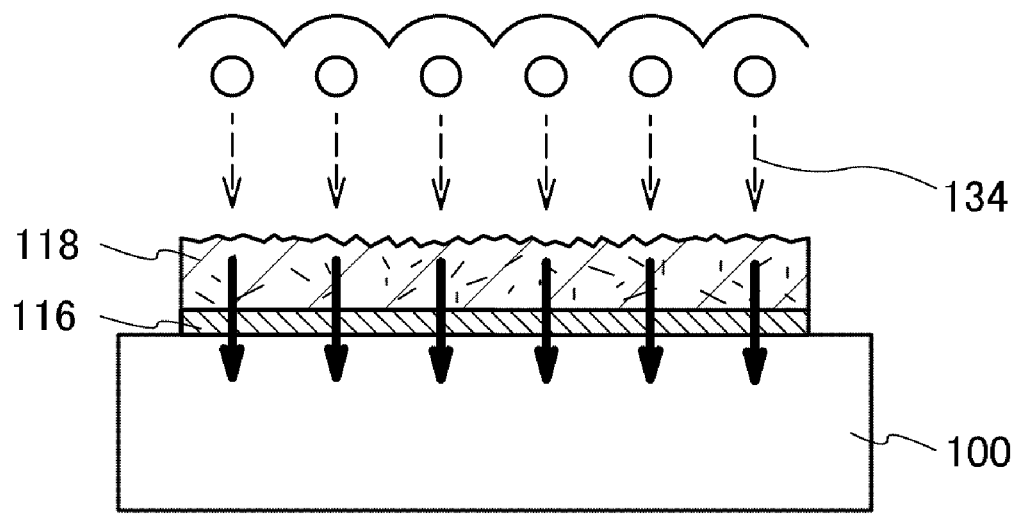
FIGS. 14A and 14B are diagrams each illustrating a state at the time of lamp light irradiation.
Figure 14B:
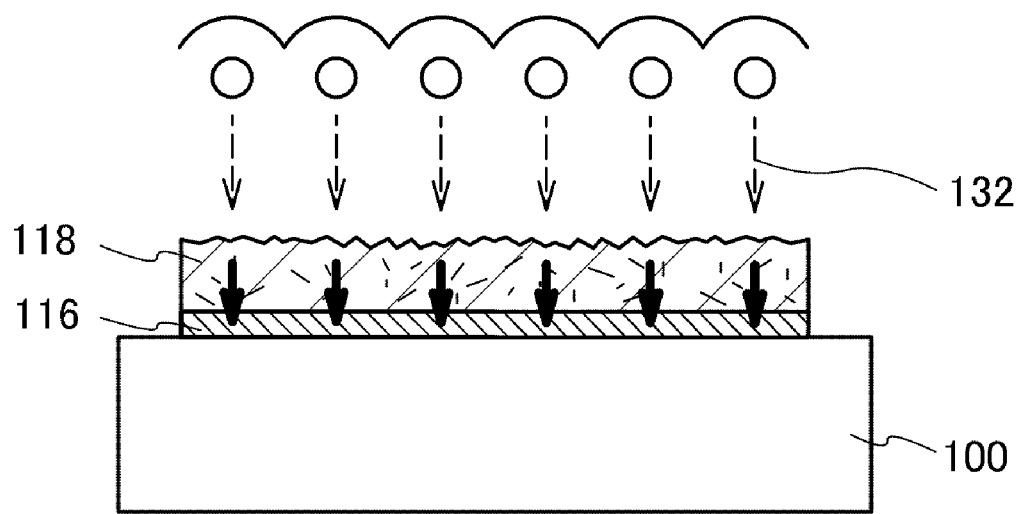

FIGS. 14A and 14B schematically illustrate a difference in effect between the case of irradiation with normal lamp light and the case of irradiation with flash lamp light. FIG. 14A illustrates the case of irradiation with normal lamp light, and FIG. 14B illustrates the case of irradiation with flash lamp light. In the drawings, thick solid arrows indicate how heat generated from light is conducted.

As illustrated in FIG. 14A, in the case of irradiation with normal lamp light 134, the irradiation time is long and the quantity of heat generated is large; thus, most of the heat generated in the semiconductor layer 118 is conducted to the base substrate 100 through the insulating layer 116. In this case, the base substrate 100 may be melted by the influence of heat. Even if not melted, the base substrate 100 may be deformed to a level that is unacceptable to the process, and mobile ions in the base substrate 100 may move to the semiconductor layer 118.

On the other hand, as illustrated in FIG. 14B, in the case of irradiation with the flash lamp light 132, the irradiation time is short and the quantity of heat generated is small; thus, most of the heat generated in the semiconductor layer 118 is not conducted to the base substrate 100. By irradiation with flash lamp light in this manner, a defect resulting from heat conduction to the base substrate 100 can be suppressed. In this regard, there is a significant technical difference between normal lamp light irradiation and flash lamp light irradiation.

Figure 2C:
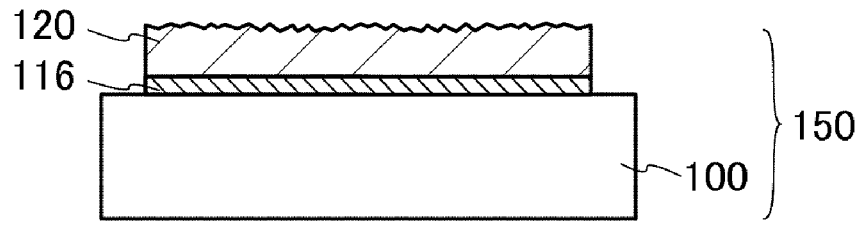

By irradiating the semiconductor layer 118 with the flash lamp light 132 as described above, a semiconductor substrate 150 including a semiconductor layer 120 whose defects have been repaired can be obtained (see FIG. 2C). Note that the semiconductor layer 120 is in a state close to a single crystal semiconductor because defects have been repaired.

Note that after the irradiation with the flash lamp light 132 is performed as described above, surface planarization treatment or thinning treatment may be performed on the semiconductor layer. Accordingly, characteristics of a semiconductor element to be manufactured can be further improved. Surface planarization or thinning of the semiconductor layer can be performed by employing, for example, etching treatment (etchback treatment) by one of dry etching and wet etching or etching treatment (etchback treatment) by both of these. Alternatively, laser light irradiation treatment may be employed unless it causes a variation in characteristics.

Note that the surface planarization treatment or the thinning treatment of the semiconductor layer is not necessarily performed after the irradiation with the flash lamp light 132. For example, planarization treatment or the like may be performed before the irradiation with the flash lamp light 132. In this case, unevenness and defects on the surface of the semiconductor layer are removed to some extent; thus, defect repair with a flash lamp can be performed more effectively. Furthermore, the above treatment may be performed both before and after the irradiation with the flash lamp light 132. Moreover, the irradiation with the flash lamp light 132 and the above treatment may be alternately repeated. By employing the irradiation with flash lamp light in combination with the above treatment in this manner, the unevenness, defects, and the like of the surface of the semiconductor layer can be drastically reduced.

In one embodiment of the disclosed invention, flash lamp light is used to repair defects of a semiconductor layer without melting the semiconductor layer. Accordingly, a whole area of the semiconductor layer can be treated at a time. Thus, productivity can be drastically improved as compared to the case of using laser light. In addition, since a semiconductor layer is not melted, a crystal grain boundary and the like resulting from generation of a melted region and an unmelted region are not produced. Thus, in-plane variation of a semiconductor layer can be reduced, and a semiconductor layer having favorable and uniform characteristics can be obtained. Furthermore, compared to heating in thermal equilibrium with a furnace or the like, treatment can be efficiently performed in an extremely short time. That is, a large-area substrate having favorable and uniform characteristics can be provided extremely efficiently.

Note that a semiconductor layer having favorable characteristics can be formed without being melted because a semiconductor layer which is separated from a single crystal semiconductor layer (a semi-single-crystal semiconductor layer) is used as the semiconductor layer. A semiconductor layer which is separated from a single crystal semiconductor substrate (a semi-single-crystal semiconductor layer) has a basic structure similar to that of a single crystal semiconductor layer and differs from a single crystal semiconductor layer simply by the presence of a large number of defects. In other words, if defects can be effectively repaired, extremely high characteristics like those of a single crystal semiconductor can also be obtained in the case of using a non-melt defect repair process.

The use of flash lamp light is very favorable for the purpose of the defect reduction. Since the irradiation with flash lamp light in the present invention is performed under non-melt conditions, it can be considered that not only thermal effect but also optical effect contributes to defect repair. In other words, it can be assumed that defect repair is achieved by local bond rearrangement due to absorption of band-gap light. Note that in the case of melting a semiconductor layer, such as in the case of irradiating a semiconductor layer with laser light, it can be said that thermal bond rearrangement mainly occurs. Furthermore, in the case of using so-called RTA (rapid thermal annealing), thermal effect with radiant heat mainly contributes.

The time of irradiation with flash light lamp (pulse width) can be 10 μs or more (preferably 10 μs to 100 ms, more preferably 100 μs to 10 ms), and that can be said to be sufficient time for rearrangement of defective bonds. In addition, since light from a flash lamp is so-called white light, it acts on various types of defects as compared to the case of using laser light that is monochromatic light. That is, even if there are a plurality of defects having different energy levels in a semiconductor layer, light can be effectively absorbed to cause bond rearrangement and to repair the defects. Furthermore, with the use of so-called white light, defects can be repaired without much dependence on thickness; thus, a favorable semiconductor layer can be obtained regardless of its thickness.

In addition, since the time of irradiation with flash lamp light is sufficiently shorter than that with normal lamp light, the quantity of heat provided to a base substrate can be sufficiently reduced. Accordingly, defects resulting from melting of a base substrate or the like can be sufficiently reduced. Note that the time of irradiation with normal lamp light is 0.5 s or more.

Note that in a process which requires melting of a semiconductor layer, such as in the case of laser light irradiation, there is a problem in that the range of optimal power densities is narrow. On the other hand, in one embodiment of the disclosed invention, melting of a semiconductor layer is not needed; thus, the range of optimal power densities is broad and that is extremely advantageous in a manufacturing process of a semiconductor substrate.

Embodiment 2

In Embodiment 2, a variation of the method for manufacturing a semiconductor substrate in Embodiment 1 will be described. Specifically, the case of employing planarization treatment by etching will be described with reference to FIGS. 3A to 3D and FIGS. 4A to 4D. Note that many parts of a manufacturing process of a semiconductor substrate described in this embodiment are the same as those in Embodiment 1. Thus, description of parts overlapping with those in Embodiment 1 will be omitted below, and differences will be mainly described.

First, a method illustrated in FIGS. 3A to 3D is described.

First, in accordance with the method described in Embodiment 1 or the like, a base substrate 100 and a substrate 140 are bonded together, and then, the substrate 140 is divided into a single crystal semiconductor substrate 142, and an insulating layer 116 and a semiconductor layer 118. Accordingly, a semiconductor substrate including the semiconductor layer 118 over the base substrate 100 is formed (see FIG. 3A). Note that Embodiment 1 can be referred to for steps to the structure of FIG. 3A; thus, detailed description is omitted. Note that the above-mentioned semiconductor substrate has a structure where the insulating layer 116 and the semiconductor layer 118 are sequentially stacked over the base substrate 100.

Next, the semiconductor layer 118 is irradiated with flash lamp light 132. More specifically, a whole area of the semiconductor layer 118 is irradiated with the flash lamp light 132 (see FIG. 3B). In that case, the light intensity of the flash lamp light is set such that the semiconductor layer 118 is not melted (or such that the planarity of the surface of the semiconductor layer is not changed). The time of irradiation with the flash lamp light (pulse width) is 10 μs or more (preferably 10 μs to 100 ms, more preferably 100 μs to 10 ms). During the irradiation with the flash lamp light 132, the temperature of the base substrate 100 is preferably kept at 300° C. or higher (more preferably 500° C. or higher). Accordingly, defect repair can be performed effectively.

The flash lamp light 132 is preferably light having a continuous spectrum in a visible light region (at least from 400 nm to 700 nm), that is, white light. With the use of flash lamp light as mentioned above, the flash lamp light 132 can penetrate to a sufficient depth even when the semiconductor layer 118 is thick. That is, defect repair can be favorably performed.

Embodiment 1 can be referred to for other conditions for the irradiation with the flash lamp light 132, which are omitted here.

By irradiating the semiconductor layer 118 with the flash lamp light 132 as described above, a semiconductor substrate 150 including a semiconductor layer 120 whose defects have been repaired can be obtained (see FIG. 3C). Note that the semiconductor layer 120 is in a state close to a single crystal semiconductor because defects have been repaired.

Next, planarization treatment is performed on the semiconductor layer 120. Specifically, for example, etching treatment (etchback treatment) by one of dry etching and wet etching or etching treatment (etchback treatment) by both of these can be employed. As dry etching treatment, etching treatment using an etching gas, for example, a chloride gas such as boron chloride, silicon chloride, or carbon tetrachloride, a fluoride gas such as sulfur fluoride or nitrogen fluoride, a chlorine gas, an oxygen gas, or the like can be employed. As wet etching treatment, etching treatment using an etching solution, for example, a tetramethylammonium hydroxide (abbr.: TMAH) solution or the like can be employed.

As described above, by performing flash lamp light irradiation in combination with etching treatment, a semiconductor substrate 152 including a semiconductor layer 160 whose defects have been drastically reduced and surface unevenness has been sufficiently reduced can be obtained (see FIG. 3D).

Next, a method illustrated in FIGS. 4A to 4D is described.

First, by a method similar to that described above, a semiconductor substrate including a semiconductor layer 118 over a base substrate 100 is formed (see FIG. 4A). The semiconductor substrate has a structure where an insulating layer 116 and the semiconductor layer 118 are sequentially stacked over the base substrate 100.

Next, planarization treatment is performed on the semiconductor layer 118. Specifically, for example, etching treatment (etchback treatment) by one of dry etching and wet etching or etching treatment (etchback treatment) by both of these can be employed. As dry etching treatment, etching treatment using an etching gas, for example, a chloride gas such as boron chloride, silicon chloride, or carbon tetrachloride, a fluoride gas such as sulfur fluoride or nitrogen fluoride, a chlorine gas, an oxygen gas, or the like can be employed. As wet etching treatment, etching treatment using an etching solution, for example, a tetramethylammonium hydroxide (abbr.: TMAH) solution or the like can be employed.

By performing etching treatment on the semiconductor layer 118 in this manner, a semiconductor layer 126 whose surface unevenness has been sufficiently reduced can be obtained (see FIG. 4B).

Next, the semiconductor layer 126 which has been planarized by etching treatment is irradiated with flash lamp light 132 (see FIG. 4C). In that case, the light intensity of the flash lamp light is set such that the semiconductor layer 126 is not melted (or such that the planarity of the surface of the semiconductor layer is not changed). The time of irradiation with the flash lamp light (pulse width) is 10 μs or more (preferably 10 μs to 100 ms, more preferably 100 μs to 10 ms). During the irradiation with the flash lamp light 132, the temperature of the base substrate 100 is preferably kept at 300° C. or higher (more preferably 500° C. or higher). Accordingly, defect repair can be performed effectively.

The flash lamp light 132 is preferably light having a continuous spectrum in a visible light region (at least from 400 nm to 700 nm), that is, white light. With the use of flash lamp light as mentioned above, the flash lamp light 132 can penetrate to a sufficient depth even when the semiconductor layer 126 is thick. That is, defect repair can be favorably performed.

Embodiment 1 can be referred to for other conditions for the irradiation with the flash lamp light 132, which are omitted here.

By irradiating the semiconductor layer 126 with the flash lamp light 132 as described above, a semiconductor substrate 152 including a semiconductor layer 160 whose defects have been repaired can be obtained (see FIG. 4D). Note that in the method illustrated in FIGS. 4A to 4D, the irradiation with the flash lamp light 132 is performed after the etching treatment is performed. Accordingly, unevenness and defects of the surface of the semiconductor layer can be reduced to some extent; thus, defect repair with a flash lamp can be performed more effectively. Here, the semiconductor layer 160 is in a state close to a single crystal semiconductor because defects have been repaired.

This embodiment can be implemented in combination with Embodiment 1 as appropriate.

Embodiment 3

In Embodiment 3, another example of a method for manufacturing a semiconductor substrate of the present invention will be described with reference to FIGS. 5A to 5E and FIGS. 6A to 6C. Note that many parts of a manufacturing process of a semiconductor substrate described in this embodiment are the same as those in Embodiment 1. Thus, differences will be mainly described.

First, a base substrate 100 is prepared (see FIG. 5A). Embodiment 1 can be referred to for the details of the base substrate 100. In addition, a single crystal semiconductor substrate 110 is prepared. Embodiment 1 can be referred to also for the details of the single crystal semiconductor substrate 110.

Next, a variety of treatments are performed on the single crystal semiconductor substrate 110 to form a damaged region 114 and an insulating layer 116 (see FIG. 5B).

Embodiment 1 may be referred to for the details of the variety of treatments. Note that the damaged region 114 is a region which contains ions at high concentration, and the single crystal semiconductor substrate 110 can be divided along the region. Thus, the thickness of a semiconductor layer which is separated from the single crystal semiconductor substrate 110 is determined by the depth at which the damaged region 114 is formed. In this embodiment, the damaged region 114 is formed at a depth of 50 nm to 300 nm from a surface of the single crystal semiconductor substrate 110. In addition, a structure where the single crystal semiconductor substrate 110 is provided with the damaged region 114 and the insulating layer 116 is referred to as a substrate 140.

After that, the base substrate 100 and the substrate 140 are bonded to each other (see FIG. 5C). Then, heat treatment is performed on the base substrate 100 and the substrate 140 which have been bonded to each other, to strengthen the bond. For the details, Embodiment 1 can be referred to.

Next, the substrate 140 is divided along the damaged region 114 into a single crystal semiconductor substrate 142 and a semiconductor layer 118 (see FIG. 5D). Division of the substrate 140 is conducted by heat treatment. For the details, Embodiment 1 can be referred to.

Defects due to the ion irradiation step or the division step exist in the semiconductor layer 118 formed as described above. If the semiconductor layer 118 has many defects, characteristics as a single crystal semiconductor cannot be exhibited. Therefore, defect reduction treatment is performed on the semiconductor layer 118.

In this embodiment, defect reduction in the semiconductor layer 118 is achieved by irradiating the semiconductor layer 118 with flash lamp light 132. More specifically, a whole area of the semiconductor layer 118 is irradiated with the flash lamp light 132 (see FIG. 5E). In that case, the light intensity of the flash lamp light is set such that the semiconductor layer 118 is not melted (or such that the planarity of the surface of the semiconductor layer is not changed). Note that the optimal light intensity of the flash lamp light varies depending on the thickness of the semiconductor layer 118 or the like; thus, the light intensity of the flash lamp light is preferably set as appropriate. The time of irradiation with the flash lamp light (pulse width) is 10 μs or more (preferably 10 μs to 100 ms, more preferably 100 μs to 10 ms). During the irradiation with the flash lamp light 132, the temperature of the base substrate 100 is preferably kept at 300° C. or higher (more preferably 500° C. or higher). Accordingly, defect repair can be performed effectively.

The flash lamp light 132 is preferably light having a continuous spectrum in a visible light region (at least from 400 nm to 700 nm), that is, white light. With the use of flash lamp light as mentioned above, the flash lamp light 132 can penetrate to a sufficient depth even when the semiconductor layer 118 is thick. That is, defect repair can be favorably performed.

Note that the irradiation with the flash lamp light 132 is preferably performed in, but not limited to, a vacuum or a reduced-pressure atmosphere. In the case of irradiation with the flash lamp light 132, unlike in the case of irradiation with laser light, the semiconductor layer 118 is not melted. Therefore, a problem of surface oxidation or the like is not so serious as in the case of using laser light, and a sufficiently favorable semiconductor layer can also be obtained in the case of an atmosphere other than a vacuum or a reduced-pressure atmosphere. Also in this regard, it can be said that a method using the flash lamp light 132 has an advantage over a method using laser light.

Needless to say, the irradiation with the flash lamp light 132 may be performed in the air atmosphere or other atmospheres. For example, the irradiation with the flash lamp light 132 can be performed in an inert atmosphere such as nitrogen or argon. In order to perform the irradiation with the flash lamp light 132 in an inert atmosphere, the irradiation with the flash lamp light 132 may be performed in an airtight chamber, and the atmosphere in this chamber may be controlled.

There is no particular limitation on a flash lamp that is a light source of the flash lamp light; for example, a xenon lamp, a halogen lamp, a high pressure UV lamp, an ultra high pressure UV lamp, or the like can be used. In particular, it can be said that a xenon lamp (a xenon flash lamp) is extremely suitable for the present invention because it can easily emit light repeatedly with high light intensity. Although FIG. 5E illustrates an example in which a plurality of flash lamps are disposed parallel and are each provided with a reflector plate, the disposition and structure of flash lamps (and reflector plates) are not limited to this example. The number and size of flash lamps can also be appropriately set.

By irradiating the semiconductor layer 118 with the flash lamp light 132 as described above, a semiconductor substrate including a semiconductor layer 120 whose defects have been repaired can be obtained. Note that the semiconductor layer 120 is in a state close to a single crystal semiconductor because defects have been repaired.

Note that after the irradiation with the flash lamp light 132 is performed as described above, surface planarization treatment or the like may be performed. Accordingly, characteristics of a semiconductor element to be manufactured can be further improved. Surface planarization or the like can be performed by employing, for example, etching treatment (etchback treatment) by one of dry etching and wet etching or etching treatment (etchback treatment) by both of these. Alternatively, laser light irradiation treatment may be employed unless it causes a variation in characteristics.

Next, a semiconductor layer 122A is formed by epitaxial growth (vapor-phase growth, vapor-phase epitaxial growth) on the semiconductor layer 120 (see FIG. 6A). That is, the semiconductor layer 122A is a semiconductor layer which is influenced by the crystallinity of the semiconductor layer 120. Here, the semiconductor layer 122A may be formed by selecting a material in accordance with the semiconductor layer 120. In the case of forming a silicon layer as the semiconductor layer 122A, the silicon layer can be formed by a plasma CVD method using a mixed gas of a silane based gas (typically, silane) and a hydrogen gas as a source gas. The semiconductor layer 122A is formed to have a thickness of approximately 5 nm to 500 nm, preferably approximately 10 nm to 100 nm.

The above-mentioned source gas is a mixed gas in which the flow rate of the hydrogen gas is 50 times or more (preferably, 100 times or more) as high as that of the silane based gas. For example, silane ($SiH_4$) and hydrogen may be used after being mixed at flow rates of 4 sccm and 400 sccm, respectively. By increasing the flow rate of the hydrogen gas, a semiconductor layer having high crystallinity can be formed. Thus, the amount of hydrogen contained in the semiconductor layer can be reduced.

Note that the silane based gas is not limited to the above-mentioned silane, and disilane ($Si_2H_6$) or the like may be used. In addition, a noble gas may be added to the source gas.

Other conditions for formation of the semiconductor layer 122A by a plasma CVD method are as fallows: the frequency is 10 MHz to 200 MHz; the power, 5 W to 50 W; the pressure in the chamber, 10 Pa to $10^3$ Pa; the electrode interval (in the case of a parallel-plate type), 15 mm to 30 mm; the temperature of the base substrate 100, 200° C. to 400° C. The typical conditions of the above are as follows: the frequency, 60 MHz; the power, 15 W; the pressure in the chamber, 100 Pa; the electrode interval, 20 mm; and the temperature of the base substrate 100, 280° C. The above film formation conditions are merely an example, and one embodiment of the disclosed invention should not be construed as being limited to this example. The important point here is to form a semiconductor layer having high crystallinity (or a semiconductor layer having low hydrogen concentration or a semiconductor layer having low hydrogen content) as the semiconductor layer 122A; therefore, the semiconductor layer 122A may be formed by any formation method as long as that object can be achieved.

Note that a native oxide layer formed on a surface of the semiconductor layer 120 and the like are preferably removed before the semiconductor layer 122A is formed by epitaxial growth. This is because when an oxide layer is formed on the surface of the semiconductor layer 120, the epitaxial growth which is influenced by the crystallinity of the semiconductor layer 120 cannot be advanced and the crystallinity of the semiconductor layer 122A is lowered. Here, the oxide layer can be removed using a chemical solution containing a fluorinated acid, or the like.

Next, a semiconductor layer 122B is formed over the semiconductor layer 122A (see FIG. 6B). Here, the semiconductor layer 122B is formed by selecting a material in accordance with the semiconductor layer 122A. In addition, the semiconductor layer 122B is formed to have a thickness of 200 nm to 2 μm (preferably, 400 nm to 1 μm). At that time, an oxide layer formed on a surface of the semiconductor layer 122A is preferably removed.

The semiconductor layer 122B is formed to be a semiconductor layer having lower crystallinity than the semiconductor layer 122A. Alternatively, the semiconductor layer 122B is formed to be a semiconductor layer having higher hydrogen concentration (a semiconductor layer having higher hydrogen content) than the semiconductor layer 122A. As such a semiconductor layer 122B, for example, an amorphous semiconductor layer may be formed.

The formation method of the semiconductor layer 122B can be determined as appropriate; however, the semiconductor layer 122B is preferably formed at higher film-formation rate than at least the semiconductor layer 122A. For example, when the semiconductor layer 122B is formed by a plasma CVD method using a mixed gas of a silane based gas (typically, silane) and a hydrogen gas as a source gas, it is preferable that the flow ratio of the hydrogen gas to the silane based gas be 2:1 to 20:1 (preferably, 5:1 to 15:1). Further, it is preferable that the frequency be set at 10 MHz to 200 MHz; the power, 5 W to 50 W; the pressure in the chamber, 10 Pa to $10^3$ Pa; the electrode interval (in the case of a parallel-plate type), 15 mm to 30 mm; the temperature of the base substrate 100, 200° C. to 400° C. Typically, the flow rates of silane ($SiH_4$) and hydrogen are 25 sccm and 150 sccm, respectively; the frequency, 27 MHz; the power, 30 W, the pressure, 66.6 Pa; the electrode interval, 25 mm; and the substrate temperature, 280° C. The above-mentioned film-formation conditions are merely an example, and one embodiment of the disclosed invention should not be construed as being limited to this example.

After that, heat treatment is performed and a semiconductor layer 124 is formed by solid-phase epitaxial growth (solid-phase growth) (see FIG. 6C). Note that the semiconductor layer 122A corresponds to a lower layer region 124A of the semiconductor layer 124, and the semiconductor layer 122B corresponds to an upper layer region 124B of the semiconductor layer 124.

The above-mentioned heat treatment can be performed using a heat treatment apparatus such as a rapid thermal annealing (RTA) apparatus, a furnace, a millimeter wave heating apparatus, or the like. As a heating method of the heat treatment apparatus, a resistance heating method, a lamp heating method, a gas heating method, an electromagnetic heating method, or the like can be given. The heat treatment may be performed by laser light irradiation or thermal plasma jet irradiation.

In general, a furnace is an external heating method, and the inside of the chamber and a process object are in thermal equilibrium. On the other hand, an RTA apparatus is an apparatus for performing instantaneous heating (rapid heating) by directly giving energy to a process object, and the inside of the chamber and the process object are in thermal nonequilibrium. As the RTA apparatus, an RTA apparatus by a lamp heating method (a lamp rapid thermal annealing (LRTA) apparatus), an RTA apparatus by a gas heating method using a heated gas (a gas rapid thermal annealing (GRTA) apparatus), an RTA apparatus by both a lamp heating method and a gas heating method, or the like can be given.

When an RTA apparatus is used, it is preferable that the treating temperature be 500° C. to 750° C. and the treating time be 0.5 minutes to 10 minutes. When a furnace is used, it is preferable that the treating temperature be 500° C. to 650° C. and the treating time be 1 hour to 4 hours. Needless to say, there is no need to interpret treating temperature and treating time as being limited to those given above, and it is possible to set treating temperature and treating time as appropriate depending on the allowable temperature limit of the base substrate and the like.

Through the above steps, a stacked structure of the semiconductor layer 120 and the semiconductor layer 124 is formed. Note that if a semiconductor layer having high crystallinity is not necessary, the above-mentioned heat treatment step can be omitted. Furthermore, instead of the above-mentioned heat treatment, flash lamp light irradiation may be performed under non-melt conditions.

In this embodiment, after the semiconductor layer 122A (a semiconductor layer having high crystallinity, a semiconductor layer having low hydrogen concentration) is formed by vapor-phase growth, the semiconductor layer 122B (a semiconductor layer having low crystallinity, a semiconductor layer having high hydrogen concentration) is formed thick, and then, the semiconductor layer 124 is formed by solid-phase growth. Thus, the film formation rate is secured and the occurrence of separation between semiconductor layers can be suppressed. That is, a single crystal semiconductor layer which has a predetermined thickness can be formed with high productivity and high yield.

It can be considered that the reason why the occurrence of separation can be reduced by forming the stacked structure of the semiconductor layer 122A having high crystallinity and the semiconductor layer 122B having low crystallinity over the semiconductor layer 120 and performing solid-phase growth as described above is because the difference in crystallinity between adjacent layers becomes smaller, so that bonding between atoms at the interface is strengthened and adhesion is increased.

In this embodiment, although the semiconductor layer 122A having high crystallinity is formed between the semiconductor layer 120 and the semiconductor layer 122B having low crystallinity, there is no need to interpret one embodiment of the disclosed invention as being limited thereto in consideration of the above reason. That is, a plurality of semiconductor layers having different crystallinities may be provided between the semiconductor layer 120 and the semiconductor layer 122B having low crystallinity. For example, a semiconductor layer having high crystallinity, a semiconductor layer having slightly high crystallinity, and a semiconductor layer having low crystallinity can be sequentially formed over a semiconductor layer (in this embodiment, the semiconductor layer 120). With this structure, adhesion can be further improved.

In terms of adhesion at the interface, the stacked structure is preferably formed so as to be exposed to as little air or the like as possible. For example, the semiconductor layer 122A and the semiconductor layer 122B are preferably formed successively in the same chamber.

In the manner described above, a semiconductor substrate having a thick semiconductor layer can be manufactured. Note that in this embodiment, planarization treatment is not performed on the surface of the semiconductor layer 120; thus, the surface of the semiconductor layer 124 is strongly influenced by the surface of the semiconductor layer 120. Therefore, if necessary, the surface of the semiconductor layer 124 may be planarized.

In this embodiment, the method in which the semiconductor layer 120 and the semiconductor layer 124 are formed over the base substrate 100 with the insulating layer 116 interposed therebetween is described. However, the present invention should not be interpreted as being limited thereto. For example, layers having various functions (hereinafter referred to as functional layers) may be provided below the semiconductor layer 120. For example, a layer containing a conductive material, a layer containing an impurity element (a semiconductor layer containing an impurity element), or the like may be formed as a functional layer.

Note that in this embodiment, the semiconductor layer 122A and the semiconductor layer 122B are formed after the semiconductor layer 120 whose defects have been reduced by irradiation with the flash lamp light 132 is formed. However, the present invention should not be interpreted as being limited thereto. For example, it is also possible to form the semiconductor layer 122A and the semiconductor layer 122B over the semiconductor layer 118 and then perform irradiation with the flash lamp light 132. In this case, defects in the semiconductor layer 118 can also be reduced sufficiently.

This embodiment can be implemented in combination with Embodiment 1 or 2 as appropriate.

Embodiment 4

In Embodiment 4, an example of irradiation with flash lamp light will be described with reference to FIGS. 7A and 7B. Note that a method described in this embodiment is merely an example, and one embodiment of the disclosed invention should not be interpreted as being limited to the method described in this embodiment.

Figure 7A:
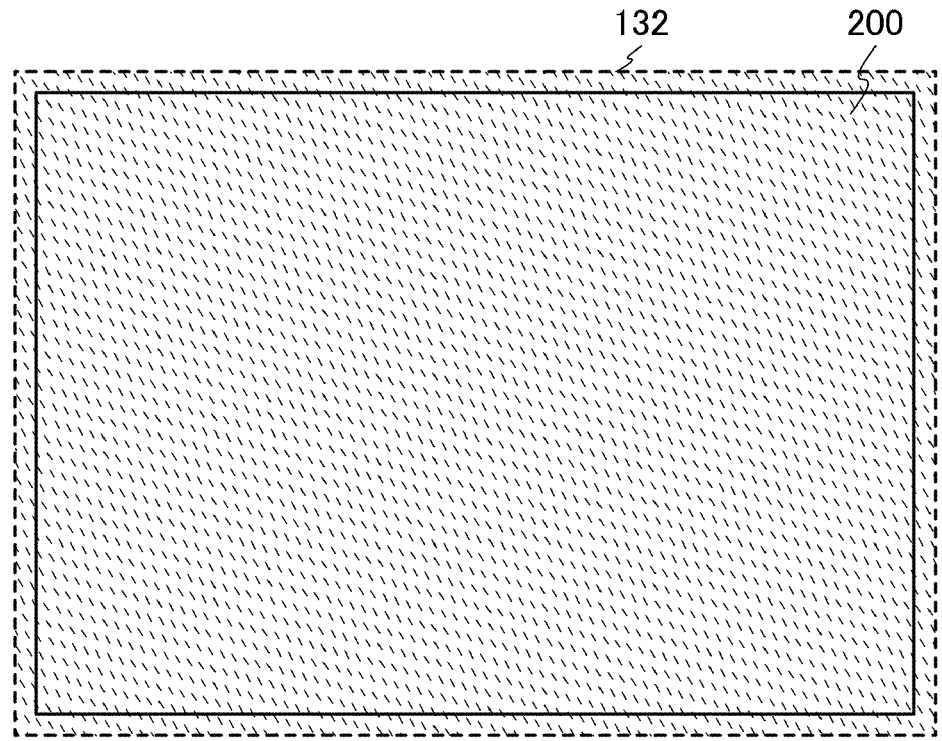
FIGS. 7A and 7B are diagrams illustrating an irradiation method with a flash lamp.

First, a case in which a region irradiated with flash lamp light 132 in the semiconductor layer 200 is large is described (see FIG. 7A). In this case, a whole area of the semiconductor layer 200 is irradiated with the flash lamp light 132. By irradiating the whole area of the semiconductor layer 200 with flash lamp light as described above, the time for irradiation with flash lamp light can be suppressed to a minimum. That is, a semiconductor substrate can be manufactured efficiently.

Figure 7B:
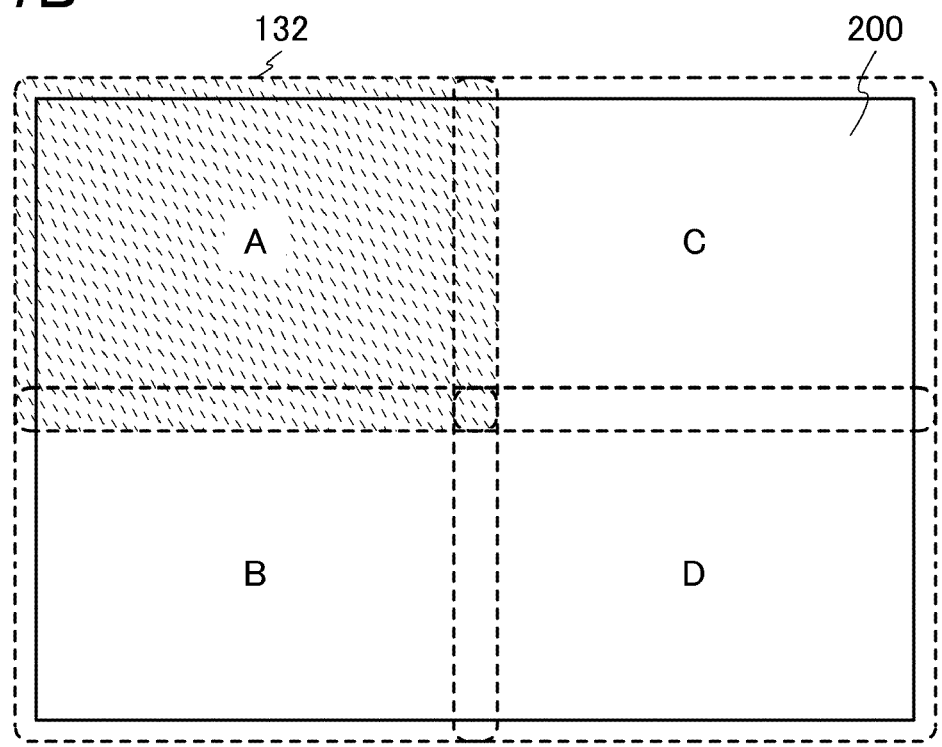

Next, a case in which a region irradiated with the flash lamp light 132 in the semiconductor layer 200 is small is described (see FIG. 7B). Note that FIG. 7B illustrates an example in which the semiconductor layer 200 is divided into four regions, which are separately irradiated with the flash lamp light 132. Flash lamp light irradiation regions (A to D) are provided to overlap partly so that the whole area of the semiconductor layer 200 be irradiated with flash lamp light.

In the present invention, the irradiation with the flash lamp light 132 is performed under non-melt conditions. Thus, characteristic variation of a single crystal semiconductor layer, which is a problem caused in the case of laser light irradiation, is not caused. More specifically, there is little difference in characteristics between a portion where flash lamp light irradiation regions overlap and a portion where flash lamp light irradiation regions do not overlap.

In this manner, even if regions irradiated with the flash lamp light 132 overlap, the difference in characteristics can be sufficiently small. Thus, a semiconductor substrate having an extremely uniform semiconductor layer can be provided. The effect of the present invention is significant, particularly on a large-area substrate where irradiation regions overlap.

This embodiment can be implemented in combination with any of Embodiments 1 to 3 as appropriate.

Embodiment 5

In Embodiment 5, a method for manufacturing a semiconductor device using the above-described semiconductor substrate will be described with reference to FIGS. 8A to 8D, FIGS. 9A to 9D, and FIGS. 10A and 10B. Here, a method for manufacturing a semiconductor device including a plurality of transistors as an example of the semiconductor device is described. Note that various semiconductor devices can be formed with the use of transistors described below in combination.

Figure 8A:
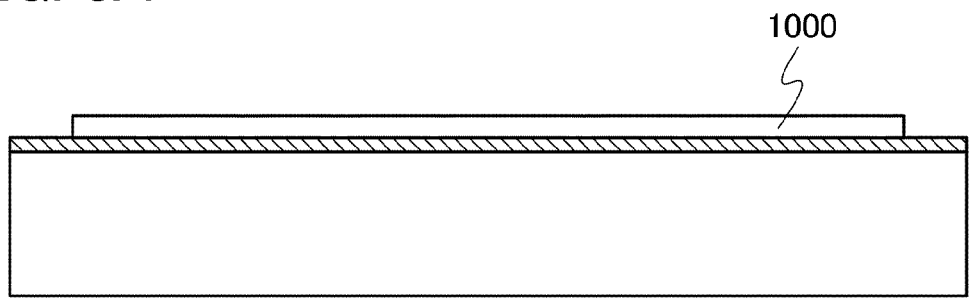
FIGS. 8A to 8D are diagrams illustrating a manufacturing process of a semiconductor device.
Figure 8B:
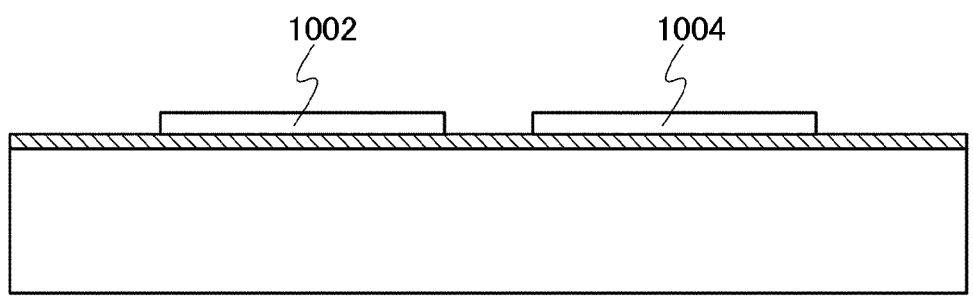

First, a semiconductor substrate manufactured by the method described in Embodiment 2 is prepared (see FIG. 8A). Note that in this embodiment, a method for manufacturing a semiconductor device using a semiconductor substrate manufactured by the method described in Embodiment 2 is described; however, one embodiment of the disclosed invention is not limited thereto. A semiconductor substrate manufactured by the method described in Embodiment 1 or the like may be used.

In order to control the threshold voltages of TFTs, a p-type impurity element such as boron, aluminum, or gallium or an n-type impurity element such as phosphorus or arsenic may be added to a semiconductor layer 1000 (corresponding to the semiconductor layer 160 in Embodiment 2). A region to which the impurity element is added and the kind of impurity element to be added can be changed as appropriate. For example, a p-type impurity element can be added to a formation region of an n-channel TFT, and an n-type impurity element can be added to a formation region of a p-channel TFT. The above impurity element may be added at a dose of approximately $1\times10^{15}/cm^2$ to $1\times10^{17}/cm^2$. Then, the semiconductor layer 1000 is divided into an island shape to form a semiconductor layer 1002 and a semiconductor layer 1004 (see FIG. 8B).

Figure 8C:
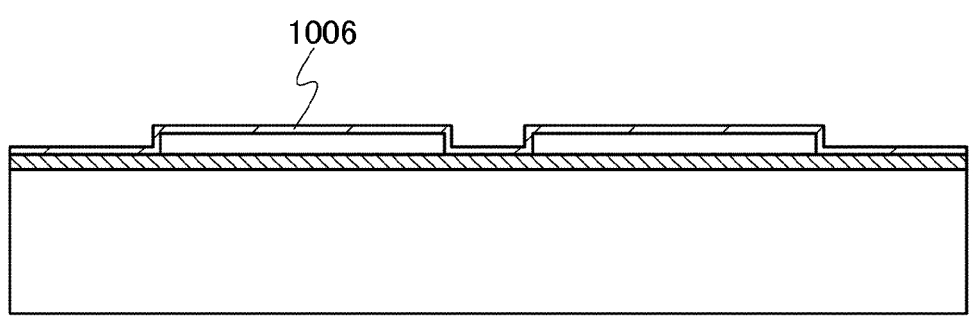

Next, a gate insulating layer 1006 is formed to cover the semiconductor layer 1002 and the semiconductor layer 1004 (see FIG. 8C). Here, a single-layer silicon oxide film is formed by a plasma CVD method. Alternatively, a film containing silicon oxynitride, silicon nitride oxide, silicon nitride, hafnium oxide, aluminum oxide, tantalum oxide, or the like may be formed to have a single-layer structure or a stacked structure as the gate insulating layer 1006.

As a manufacturing method other than a plasma CVD method, a sputtering method or a method using oxidation or nitridation by high density plasma treatment can be given. High-density plasma treatment is performed using, for example, a mixed gas of a noble gas such as helium, argon, krypton, or xenon and a gas such as oxygen, nitrogen oxide, ammonia, nitrogen, or hydrogen. In this case, if plasma excitation is performed by introduction of microwaves, plasma with low electron temperature and high density can be generated. The surfaces of the semiconductor layers are oxidized or nitrided with oxygen radicals (OH radicals may be included) or nitrogen radicals (NH radicals may be included) which are generated by such high-density plasma, whereby the insulating layer is formed to a thickness of 1 nm to 20 nm, preferably 2 nm to 10 nm to be in contact with the semiconductor layers.

Since the oxidation or nitridation of the semiconductor layers by the above-described high-density plasma treatment is a solid-phase reaction, the interface state density between the gate insulating layer 1006 and each of the semiconductor layer 1002 and the semiconductor layer 1004 can be drastically reduced. Further, when the semiconductor layers are directly oxidized or nitrided by the high-density plasma treatment, variation in the thickness of the insulating layer to be formed can be suppressed. Since the semiconductor layers have crystallinity, even when the surfaces of the semiconductor layers are oxidized by a solid-phase reaction by using the high-density plasma treatment, nonuniform oxidation at a crystal grain boundary can be suppressed; thus, a gate insulating layer with favorable uniformity and low interface state density can be formed. When an insulating layer formed by high-density plasma treatment as described above is used for a part or whole of the gate insulating layer of a transistor, variation in characteristics can be suppressed.

Alternatively, the gate insulating layer 1006 can be formed by thermally oxidizing the semiconductor layer 1002 and the semiconductor layer 1004. In the case of using such thermal oxidation, a base substrate with high heat resistance is preferably used.

Note that after a gate insulating layer 1006 containing hydrogen is formed, hydrogen contained in the gate insulating layer 1006 may be dispersed into the semiconductor layer 1002 and the semiconductor layer 1004 by performing heat treatment at a temperature of 350° C. to 450° C. In this case, the gate insulating layer 1006 may be formed by depositing silicon nitride or silicon nitride oxide by a plasma CVD method. Further, the process temperature after formation of the gate insulating layer 1006 and before hydrogen diffusion treatment is preferably set to 350° C. or lower. If hydrogen is supplied to the semiconductor layer 1002 and the semiconductor layer 1004 in this manner, defects in the semiconductor layer 1002, in the semiconductor layer 1004, at the interface between the gate insulating layer 1006 and the semiconductor layer 1002, and at the interface between the gate insulating layer 1006 and the semiconductor layer 1004 can be effectively reduced.

Figure 8D:
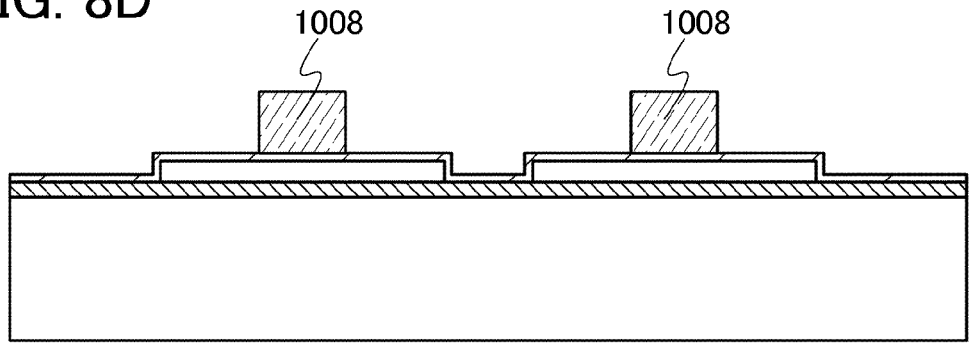

Next, a conductive layer is formed over the gate insulating layer 1006, and then, the conductive layer is processed (patterned) into a predetermined shape, whereby electrodes 1008 are formed over the semiconductor layers 1002 and 1004 (see FIG. 8D). The conductive layer can be formed by a CVD method, a sputtering method, or the like. The conductive layer can be formed using a material such as tantalum (Ta), tungsten (W), titanium (Ti), molybdenum (Mo), aluminum (Al), copper (Cu), chromium (Cr), or niobium (Nb). Alternatively, an alloy material containing the above-mentioned metal as a main component or a compound containing the above-mentioned metal can also be used. Further alternatively, a semiconductor material, such as polycrystalline silicon which is obtained by doping a semiconductor with an impurity element that imparts a conductivity type, may be used.

Although the electrodes 1008 are formed using a single-layer conductive layer in this embodiment, a semiconductor device of one embodiment of the disclosed invention is not limited to the structure. Each of the electrodes 1008 may be formed of plural conductive layers which are stacked. In the case of a two-layer structure, for example, a molybdenum film, a titanium film, a titanium nitride film, or the like may be used as the lower layer, and an aluminum film or the like may be used as the upper layer. In the case of a three-layer structure, a stacked structure of a molybdenum film, an aluminum film, and a molybdenum film, a stacked structure of a titanium film, an aluminum film, and a titanium film, or the like may be used.

Note that a mask used for forming the electrodes 1008 may be formed using a material such as silicon oxide or silicon nitride oxide. In this case, a step of forming a mask by patterning a silicon oxide film, a silicon nitride oxide film, or the like is additionally needed; however, the amount of decrease in film thickness of the mask in etching is smaller than that in the case of using a resist material; thus, the electrodes 1008 with a more precise shape can be formed. Alternatively, the electrodes 1008 may be selectively formed by a droplet discharge method without using a mask. Here, a droplet discharge method refers to a method in which droplets containing a predetermined composition are discharged or ejected to form a predetermined pattern, and includes an ink-jet method and the like in its category.

Alternatively, the electrodes 1008 can be formed by etching the conductive layer to have a desired tapered shape by an inductively coupled plasma (ICP) etching method with appropriate adjustment of etching conditions (e.g., the amount of electric power applied to a coiled electrode layer, the amount of electric power applied to a substrate-side electrode layer, the temperature of the substrate-side electrode layer, and the like). The tapered shape can be adjusted according to the shape of the mask. Note that as an etching gas, a chlorine based gas such as chlorine, boron chloride, silicon chloride, or carbon tetrachloride, a fluorine based gas such as carbon tetrafluoride, sulfur fluoride, or nitrogen fluoride, oxygen, or the like can be used as appropriate.

Figure 9A:
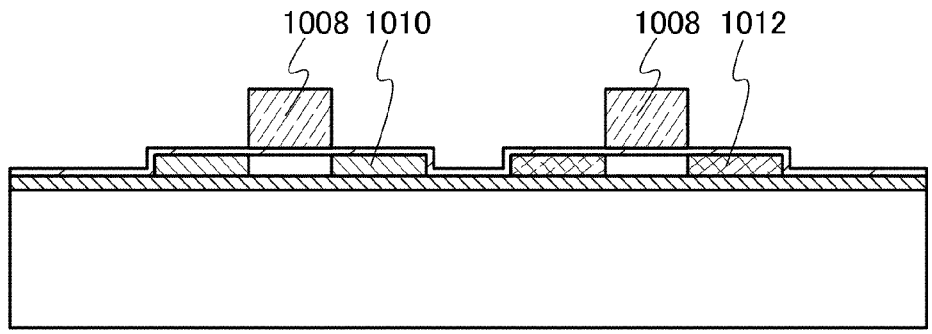
FIGS. 9A to 9D are diagrams illustrating a manufacturing process of a semiconductor device.

Next, an impurity element imparting one conductivity type is added to the semiconductor layer 1002 and the semiconductor layer 1004 using the electrodes 1008 as masks (see FIG. 9A). In this embodiment, an impurity element imparting n-type conductivity (e.g., phosphorus or arsenic) is added to the semiconductor layer 1002, and an impurity element imparting p-type conductivity (e.g., boron) is added to the semiconductor layer 1004. Note that when the impurity element imparting n-type conductivity is added to the semiconductor layer 1002, the semiconductor layer 1004 to which the p-type impurity element is added is covered with a mask or the like so that the impurity element imparting n-type conductivity is added selectively. When the impurity element imparting p-type conductivity is added to the semiconductor layer 1004, the semiconductor layer 1002 to which the impurity element imparting n-type conductivity is added is covered with a mask or the like so that the impurity element imparting p-type conductivity is added selectively. Alternatively, after an impurity element imparting one of p-type and n-type conductivities is added to the semiconductor layers 1002 and 1004, an impurity element imparting the other conductivity type may be added to only one of the semiconductor layers at a higher concentration. By the addition of the impurity elements, impurity regions 1010 and impurity regions 1012 are formed in the semiconductor layer 1002 and the semiconductor layer 1004, respectively.

Figure 9B:
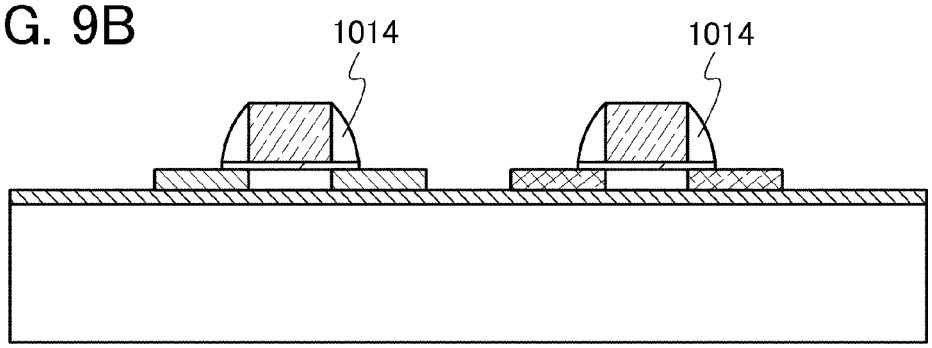

Next, sidewalls 1014 are formed on side surfaces of the electrodes 1008 (see FIG. 9B). The sidewalls 1014 can be formed by, for example, newly forming an insulating layer to cover the gate insulating layer 1006 and the electrodes 1008 and by partially etching the newly formed insulating layer by anisotropic etching mainly in a perpendicular direction. Note that the gate insulating layer 1006 may also be etched partially by the anisotropic etching described above. For the insulating layer for forming the sidewalls 1014, a film containing silicon, silicon oxide, silicon nitride, silicon oxynitride, silicon nitride oxide, an organic material, or the like may be formed to have a single layer structure or a stacked structure by a plasma CVD method, a sputtering method, or the like. In this embodiment, a 100-nm-thick silicon oxide film is formed by a plasma CVD method. In addition, as an etching gas, a mixed gas of $CHF_3$ and helium can be used. Note that the steps of forming the sidewalls 1014 are not limited to the steps described here.

Figure 9C:
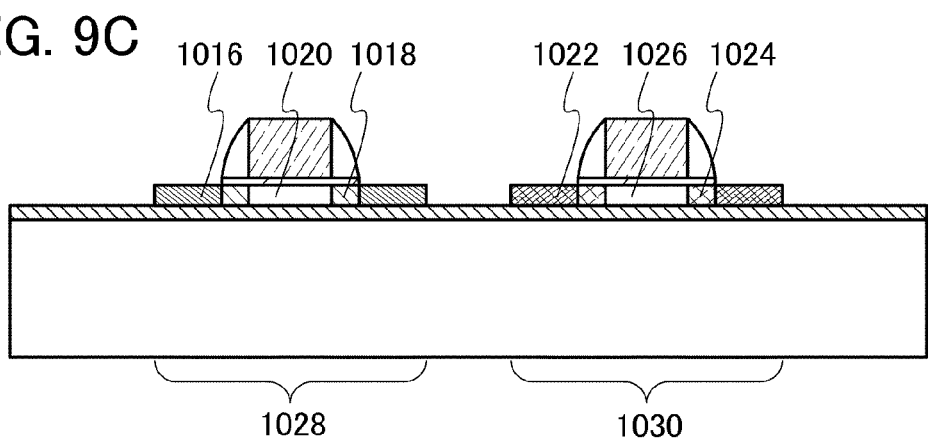

Next, impurity elements each imparting one conductivity type are added to the semiconductor layer 1002 and the semiconductor layer 1004 using the gate insulating layer 1006, the electrodes 1008, and the sidewalls 1014 as masks (see FIG. 9C). Note that the impurity elements imparting the same conductivity types as the impurity elements which have been added to the semiconductor layer 1002 and the semiconductor layer 1004 in the previous step are added to the semiconductor layer 1002 and the semiconductor layer 1004 at higher concentrations. Note that when the impurity element imparting n-type conductivity is added to the semiconductor layer 1002, the semiconductor layer 1004 to which the p-type impurity element is added is covered with a mask or the like so that the impurity element imparting n-type conductivity is added selectively. When the impurity element imparting p-type conductivity is added to the semiconductor layer 1004, the semiconductor layer 1002 to which the impurity element imparting n-type conductivity is added is covered with a mask or the like so that the impurity element imparting p-type conductivity is added selectively.

By the addition of the impurity element, a pair of high-concentration impurity regions 1016, a pair of low-concentration impurity regions 1018, and a channel formation region 1020 are formed in the semiconductor layer 1002. In addition, by the addition of the impurity element, a pair of high-concentration impurity regions 1022, a pair of low-concentration impurity regions 1024, and a channel formation region 1026 are formed in the semiconductor layer 1004. The high-concentration impurity regions 1016 and the high-concentration impurity regions 1022 each function as a source or a drain, and the low-concentration impurity regions 1018 and the low-concentration impurity regions 1024 each function as an LDD (lightly doped drain) region.

Note that the sidewalls 1014 formed over the semiconductor layer 1002 and the sidewalls 1014 formed over the semiconductor layer 1004 may be formed so as to have the same length or different lengths in a direction in which carriers travel (in a direction parallel to a so-called channel length). The length of each of the sidewalls 1014 over the semiconductor layer 1004 which constitutes part of a p-channel transistor is preferably larger than the length of each of the sidewalls 1014 over the semiconductor layer 1002 which constitutes part of an n-channel transistor. This is because boron which is added for forming a source and a drain in the p-channel transistor is easily diffused and a short channel effect is easily induced. By increasing the lengths of the sidewalls 1014 in a carrier travelling direction of the p-channel transistor, boron can be added to the source and the drain at high concentration, whereby the resistance of the source and the drain can be reduced.

In order to further reduce the resistance of the source and the drain, a silicide layer may be formed by forming silicide in part of the semiconductor layers 1002 and 1004. The silicide is formed by placing a metal in contact with the semiconductor layers and causing a reaction between the metal and silicon in the semiconductor layers by heat treatment (e.g., a GRTA method, an LRTA method, or the like). For the silicide layer, cobalt silicide or nickel silicide may be used. In the case where the semiconductor layers 1002 and 1004 are thin, silicide reaction may proceed to the bottoms of the semiconductor layers 1002 and 1004. As a metal material used for the siliciding, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Further, a silicide layer can also be formed by laser light irradiation or the like.

Through the aforementioned steps, an n-channel transistor 1028 and a p-channel transistor 1030 are formed. Note that although conductive layers each serving as a source electrode or a drain electrode have not been formed at the stage shown in FIG. 9C, a structure including these conductive layers each serving as a source electrode or a drain electrode may also be referred to as a transistor.

Figure 9D:
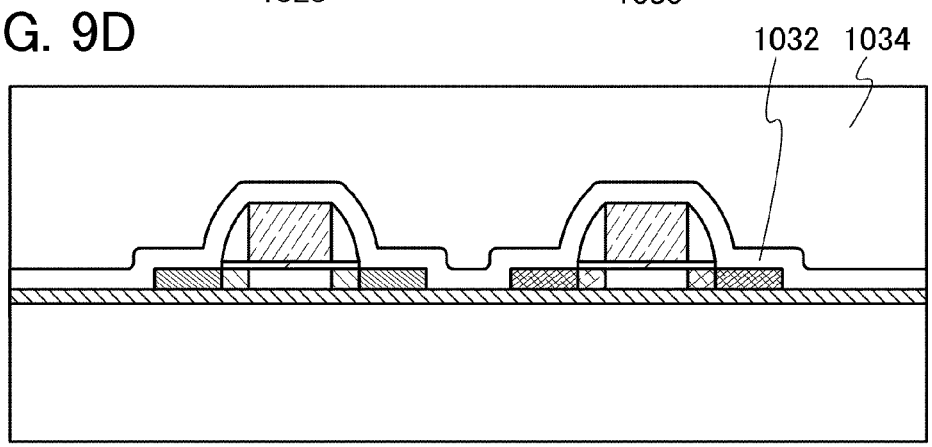

Next, an insulating layer 1032 is formed to cover the n-channel transistor 1028 and the p-channel transistor 1030 (see FIG. 9D). The insulating layer 1032 is not always necessary; however, the formation of the insulating layer 1032 can prevent impurities such as an alkali metal and an alkaline earth metal from penetrating the n-channel transistor 1028 and the p-channel transistor 1030. Specifically, the insulating layer 1032 is preferably formed using a material such as silicon oxide, silicon nitride, silicon oxynitride, silicon nitride oxide, aluminum nitride, aluminum oxide, or the like. In this embodiment, a silicon nitride oxide film with a thickness of approximately 600 nm is used as the insulating layer 1032. In this case, the above-described hydrogenation step may be performed after the silicon nitride oxide film is formed. Note that although the insulating layer 1032 is formed to have a single-layer structure in this embodiment, it is needless to say that the insulating layer 1032 may have a stacked structure. For example, in the case of a two-layer structure, the insulating layer 1032 may have a stacked structure of a silicon oxynitride film and a silicon nitride oxide film.

Next, an insulating layer 1034 is formed over the insulating layer 1032 to cover the n-channel transistor 1028 and the p-channel transistor 1030. The insulating layer 1034 may be formed using an organic material having heat resistance, such as polyimide, acrylic, benzocyclobutene, polyamide, or epoxy. Other than such an organic material, it is also possible to use a low-dielectric constant material (a low-k material), a siloxane based resin, silicon oxide, silicon nitride, silicon oxynitride, silicon nitride oxide, phosphosilicate glass (PSG), borophosphosilicate glass (BPSG), alumina, or the like. Here, the siloxane based resin corresponds to a resin including a Si—O—Si bond which is formed using a siloxane based material as a starting material. The siloxane based resin may include, besides hydrogen, at least one of fluorine, an alkyl group, and aromatic hydrocarbon as a substituent. Alternatively, the insulating layer 1034 may be formed by stacking plural insulating layers using any of these materials.

For the formation of the insulating layer 1034, the following method can be employed depending on the material of the insulating layer 1034: a CVD method, a sputtering method, an SOG method, a spin coating method, a dipping method, a spray coating method, a droplet discharge method (e.g., an ink-jet method, screen printing, offset printing, or the like), a doctor knife, a roll coater, a curtain coater, a knife coater, or the like.

Next, contact holes are formed in the insulating layers 1032 and 1034 so that each of the semiconductor layers 1002 and 1004 is partially exposed. Then, conductive layers 1036 and conductive layers 1038 are formed in contact with the semiconductor layer 1002 and the semiconductor layer 1004, respectively, through the contact holes (see FIG. 10A). The conductive layers 1036 and the conductive layers 1038 serve as source electrodes and drain electrodes of the respective transistors. Note that in this embodiment, as an etching gas used for forming the contact holes, a mixed gas of $CHF_3$ and He is employed; however, the etching gas is not limited thereto.

The conductive layers 1036 and the conductive layers 1038 can be formed by a CVD method, a sputtering method, or the like. Specifically, the conductive layers 1036 and the conductive layers 1038 can be formed using aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Moreover, an alloy containing the above-mentioned material as its main component or a compound containing the above-mentioned material may be used. The conductive layers 1036 and the conductive layers 1038 may each have a single-layer structure or a stacked structure.

As examples of an alloy containing aluminum as its main component, an alloy containing aluminum as its main component and also containing nickel, and an alloy containing aluminum as its main component and also containing nickel and one or both of carbon and silicon can be given. Since aluminum and aluminum silicon (Al—Si) have low resistance and are inexpensive, aluminum and aluminum silicon are suitable as a material for forming the conductive layers 1036 and the conductive layers 1038. In particular, aluminum silicon is preferable because a hillock can be prevented from generating due to resist baking at the time of patterning. Further, a material in which Cu is mixed into aluminum at approximately 0.5% may be used instead of silicon.

In the case where each of the conductive layers 1036 and the conductive layers 1038 is formed to have a stacked structure, a stacked structure of a barrier film, an aluminum silicon film, and a barrier film, a stacked structure of a barrier film, an aluminum silicon film, a titanium nitride film, and a barrier film, or the like may be employed, for example. Note that a barrier film refers to a film formed using titanium, a nitride of titanium, molybdenum, a nitride of molybdenum, or the like. By forming the conductive layers such that an aluminum film or an aluminum silicon film is interposed between barrier films, generation of hillocks of aluminum or aluminum silicon can be further prevented. Moreover, by forming the barrier film using titanium that is a highly reducible element, even if a thin oxide film is formed on the semiconductor layers 1002 and 1004, the oxide film is reduced by the titanium contained in the barrier film, whereby preferable contact between the conductive layers 1036 and the semiconductor layer 1002 and between the conductive layers 1038 and the semiconductor layer 1004 can be obtained. Further, it is also possible to stack a plurality of barrier films. In that case, for example, each of the conductive layers 1036 and the conductive layers 1038 can be formed to have a five-layer structure of titanium, titanium nitride, aluminum silicon, titanium, and titanium nitride in order from the bottom or a stacked structure of more than five layers.

For the conductive layers 1036 and the conductive layers 1038, tungsten silicide formed by a chemical vapor deposition method using a $WF_6$ gas and a $SiH_4$ gas may be used. Alternatively, tungsten formed by hydrogen reduction of $WF_6$ may be used for the conductive layers 1036 and 1038.

Note that the conductive layers 1036 are connected to the high-concentration impurity regions 1016 of the n-channel transistor 1028. The conductive layers 1038 are connected to the high-concentration impurity regions 1022 of the p-channel transistor 1030.

Figure 10A:
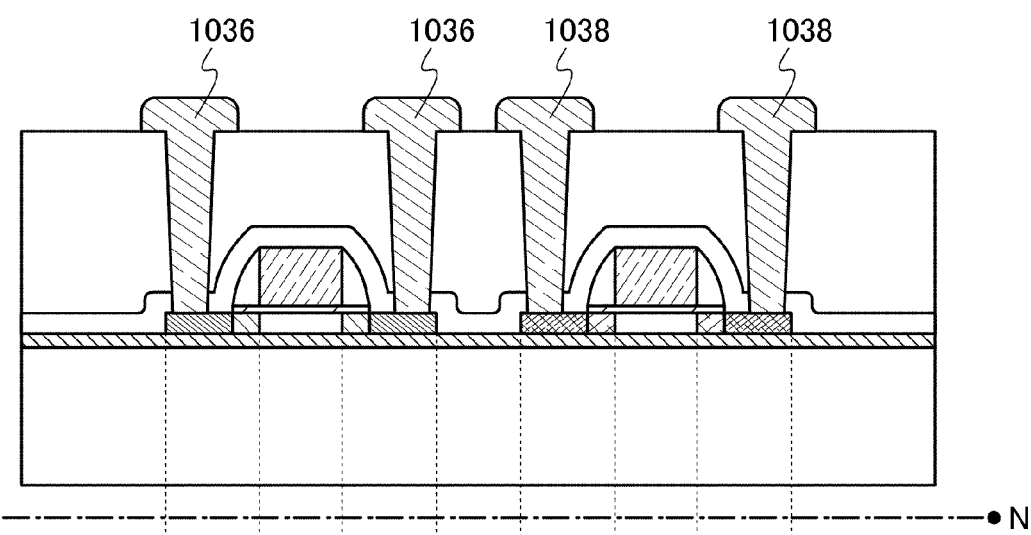
FIGS. 10A and 10B are a cross-sectional view of a semiconductor device and a plan view thereof, respectively.
Figure 10B:
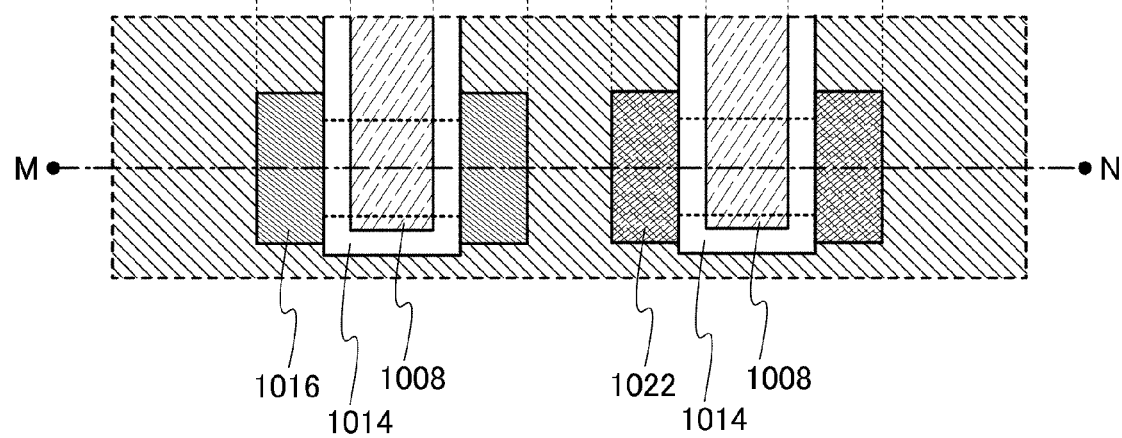

FIG. 10B is a plan view of the n-channel transistor 1028 and the p-channel transistor 1030 which are illustrated in FIG. 10A. Here, the cross section taken along the line M-N in FIG. 10B corresponds to the cross-sectional view of FIG. 10A. Note that in FIG. 10B, the conductive layers 1036, the conductive layers 1038, the insulating layers 1032 and 1034, and the like are omitted for simplicity.

Note that although the case where each of the n-channel transistor 1028 and the p-channel transistor 1030 includes one electrode 1008 serving as a gate electrode is described in this embodiment as an example, one embodiment of the disclosed invention is not limited to this structure. A transistor according to one embodiment of the disclosed invention may have, for example, a multi-gate structure in which a plurality of electrodes serving as gate electrodes are included and electrically connected to one another.

In this embodiment, a semiconductor substrate which has been subjected to etching treatment and flash lamp light irradiation treatment is used. Accordingly, it is possible to manufacture, at low cost, a transistor which has a low subthreshold value and a high field-effect mobility and can operate at high speed and can be driven at low voltage.

This embodiment can be implemented in combination with any of Embodiments 1 to 4 as appropriate.

EXAMPLE 1

Characteristics of a silicon layer which is formed over a glass substrate by the method according to one embodiment of the disclosed invention were examined. Description is made below with reference to FIGS. 11A and 11B.

First, a silicon layer was formed over a glass substrate by the method described in the above embodiment. In this example, a silicon layer having a thickness of 120 nm was formed over a glass substrate having a thickness of 0.7 mm, and the silicon layer was then irradiated with flash lamp light. Note that the temperature of the glass substrate during flash lamp light irradiation was about 500° C.

Figure 11A:
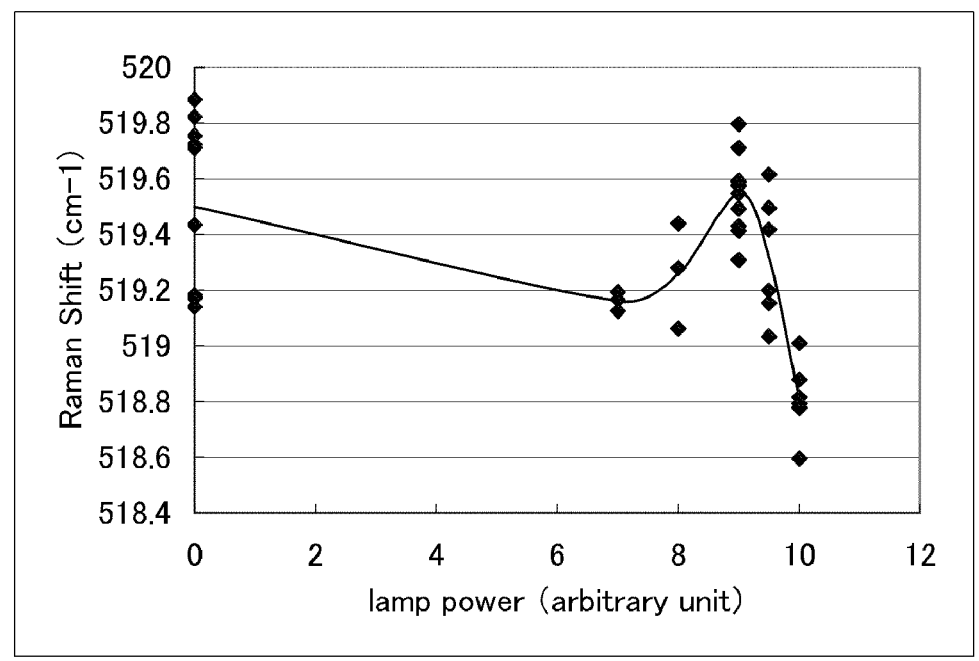
FIGS. 11A and 11B are graphs showing a dependance of Raman peak on flash lamp light intensity and a dependance of full width at half maximum of Raman peak on flash lamp light intensity.
Figure 11B:
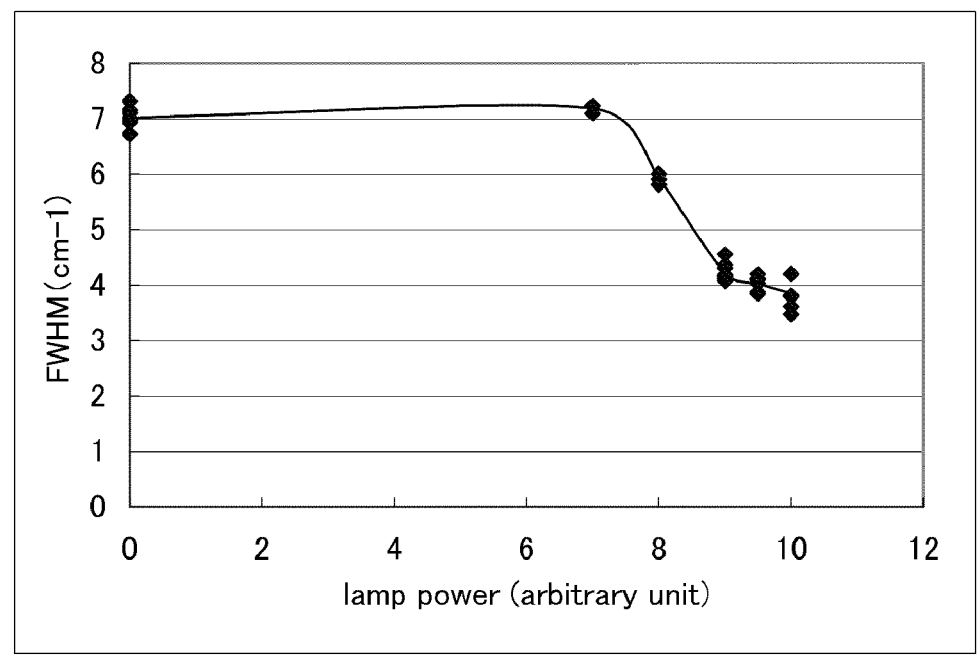

The light intensity of the flash lamp light was varied in this sample, and Raman spectra were observed. More specifically, the dependence of peak of Raman spectrum (also called Raman peak) on flash lamp light intensity (see FIG. 11A) and the dependence of full width at half maximum of Raman peak on flash lamp light intensity (see FIG. 11B) were observed. In FIG. 11A, the horizontal axis is lamp power (arbitrary unit) and the vertical axis is peak wavenumber ($cm^{-1}$) of Raman peak. In FIG. 11B, the horizontal axis is lamp power (arbitrary unit) and the vertical axis is full width at half maximum ($cm^{-1}$) of Raman peak. Here, the horizontal axis of FIG. 11A corresponds to the horizontal axis of FIG. 11B.

In FIG. 11A, the mean value of Raman peak wavenumbers at a lamp power of 9 is 519.5 $cm^{-1}$ to 519.6 $cm^{-1}$ and the value is close to that of single crystal silicon. Note that the Raman peak wavenumber of single crystal silicon is about 520 $cm^{-1}$.

A Raman spectrum is used to measure a shift in wavenumber from incident light to scattered light (Raman scattered light), and the shift in wavenumber corresponds to vibrational energy between atoms. Thus, the fact that the wavenumber of Raman peak is closer to that of single crystal silicon means that the bonding state is closer to that of single crystal silicon. That is, it can be said that characteristics of a silicon layer become closer to those of single crystal silicon when the silicon layer is irradiated with flash lamp light at appropriate light intensity.

In FIG. 11B, the full width at half maximum of Raman spectrum is about 5 $cm^{-1}$ or less at a lamp power of 9 or more. The fact that the full width at half maximum is small means that many interatomic bonds are in the same state. Thus, characteristics of a silicon layer become closer to those of single crystal silicon when the silicon layer is irradiated with flash lamp light. On the other hand, a silicon layer which is not irradiated with flash lamp light has a large full width at half maximum and has a variation in interatomic bonding state. In other words, it can be said that the silicon layer has lower crystallinity than single crystal silicon.

In summary, it can be seen that when a silicon layer is irradiated with flash lamp light at appropriate intensity, its Raman peak is at a wavenumber of about 519.2 $cm^{-1}$ to 520 $cm^{-1}$ and a full width at half maximum of about 5 $cm^{-1}$ or less.

This example can be implemented in combination with any of Embodiments 1 to 5 as appropriate.

EXAMPLE 2

It is confirmed that a semiconductor layer is not melted by irradiation with flash lamp light that is one embodiment of the disclosed invention. Specifically, surface unevenness of a semiconductor layer was observed before and after irradiation with flash lamp light. Description is made below with reference to FIGS. 12A and 12B and FIGS. 13A and 13B. Note that in this example, the same sample as that used in Example 1 was used.

First, the condition of surface unevenness of a silicon layer before irradiation with flash lamp light was observed. Specifically, surface unevenness was observed with an atomic force microscope (AFM) in three randomly selected regions (No. 01, No. 02, and No. 03) (see FIG. 12A). The surface unevenness was evaluated using Ra (arithmetic mean roughness), P-V (maximum height difference), and Rms (root-mean-square roughness) (see FIG. 12B).

After that, the condition of surface roughness of the silicon layer after irradiation with flash lamp light was observed. Specifically, four randomly selected regions (No. 04, No. 05, No. 06, and No. 07) were observed (see FIG. 13A). The surface roughness was evaluated using Ra (arithmetic mean roughness), P-V (maximum height difference), and Rms (root-mean-square roughness) (see FIG. 13B). Note that the intensity of flash lamp light with which the silicon layer was irradiated corresponds to the intensity at a lamp power of 9 in Example 1.

Figures 12A, 12B:
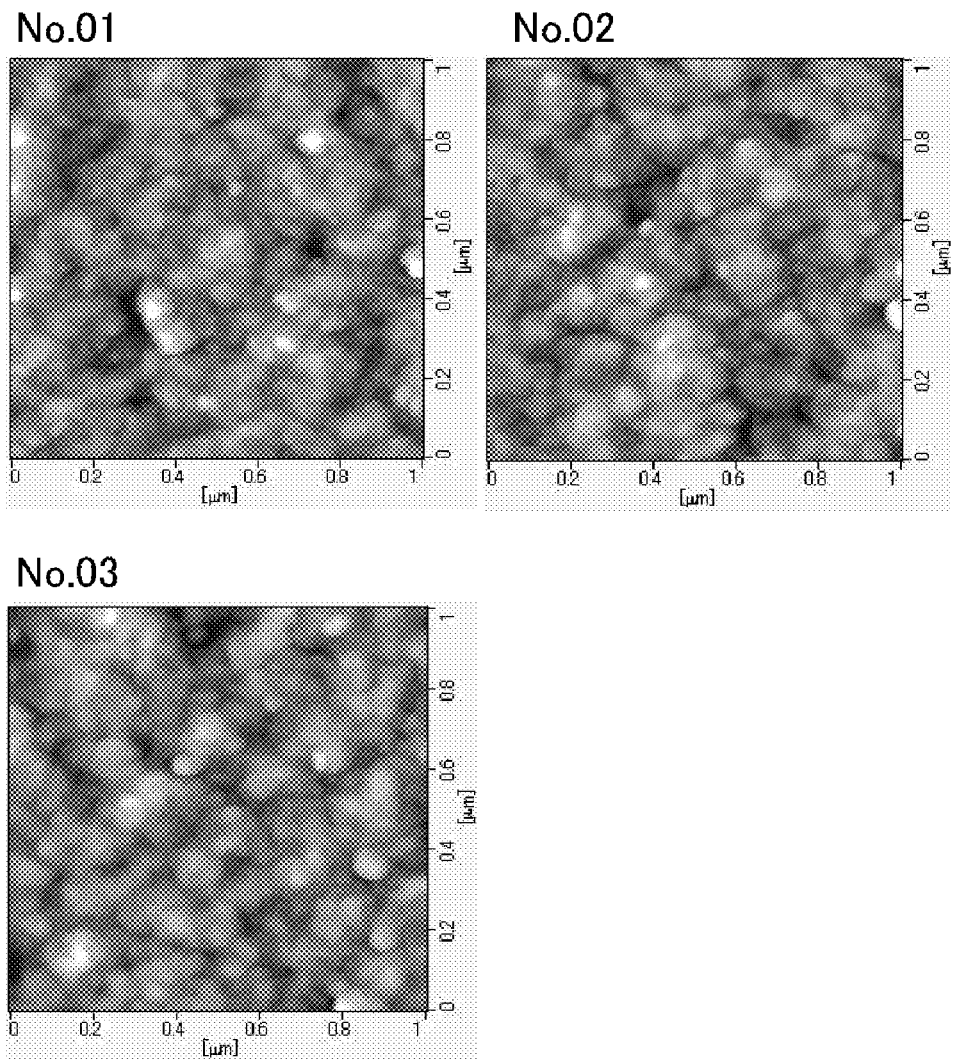
FIGS. 12A and 12B are diagrams showing a condition of surface unevenness of a silicon layer before flash lamp light irradiation.
Figures 13A, 13B:
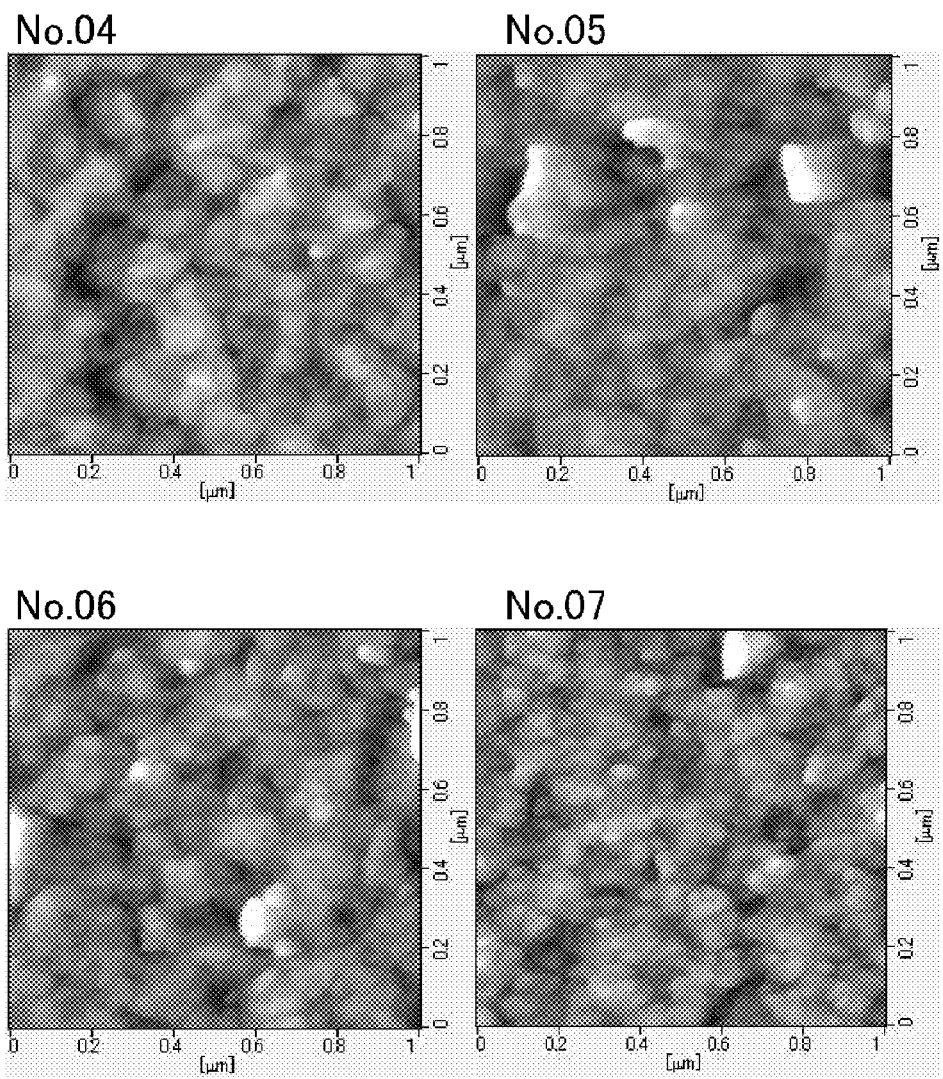
FIGS. 13A and 13B are diagrams showing a condition of surface unevenness of a silicon layer after flash lamp light irradiation.

As can be seen from FIGS. 12B and 13B, there is no large difference in each of Ra (arithmetic mean roughness), P-V (maximum height difference), and Rms (root-mean-square roughness) before and after irradiation with flash lamp light. On the other hand, it is known that a surface of a silicon layer which has been melted by irradiation with pulsed laser light has an Ra of about 1 nm to 3 nm, a P-V of about 10 nm to 40 nm, and an Rms of about 1 nm to 5 nm.

From the above results, it can be confirmed that a semiconductor layer is not melted by irradiation with flash lamp light that is one embodiment of the disclosed invention.

This example can be implemented in combination with any of Embodiments 1 to 5 and Example 1 as appropriate.

This application is based on Japanese Patent Application serial no. 2008-146914 filed with Japan Patent Office on Jun. 4, 2008, the entire contents of which are hereby incorporated by reference.

What is claimed is:

1. A method for manufacturing a semiconductor substrate, comprising the steps of:
    irradiating a surface of a single crystal semiconductor substrate with ions to form a damaged region in the single crystal semiconductor substrate;
    forming an insulating layer over the surface of the single crystal semiconductor substrate;
    disposing a surface of a substrate having an insulating surface and a surface of the insulating layer in contact with each other to bond the substrate having the insulating surface and the single crystal semiconductor substrate to each other;
    performing heat treatment to divide the single crystal semiconductor substrate along the damaged region and to form a semiconductor layer over the substrate having the insulating surface; and
    irradiating a surface of the semiconductor layer with light from a flash lamp under a condition where the semiconductor layer is not melted, to repair a defect.

2. The method for manufacturing a semiconductor substrate according to claim 1, further comprising the step of performing planarization treatment on the semiconductor layer before or after the irradiation with the light from the flash lamp.

3. The method for manufacturing a semiconductor substrate according to claim 2, wherein the planarization treatment includes etching treatment.

4. The method for manufacturing a semiconductor substrate according to claim 1, wherein a time of irradiation with the light from the flash lamp is 10 µs or more.

5. The method for manufacturing a semiconductor substrate according to claim 1, wherein the light from the flash lamp has a continuous spectrum in a wavelength range from 400 nm to 700 nm.

6. The method for manufacturing a semiconductor substrate according to claim 1, wherein the flash lamp is a xenon lamp.

7. The method for manufacturing a semiconductor substrate according to claim 1, wherein a temperature of the substrate having the insulating surface is kept at 300° C. or higher during the irradiation with the light from the flash lamp.

8. A method for manufacturing a semiconductor substrate, comprising the steps of:
    irradiating a surface of a single crystal semiconductor substrate with ions to form a damaged region in the single crystal semiconductor substrate;
    forming a first insulating layer over the surface of the single crystal semiconductor substrate;
    forming a second insulating layer over a surface of a substrate having an insulating surface;
    disposing a surface of the second insulating layer and a surface of the first insulating layer in contact with each other to bond the substrate having the insulating surface and the single crystal semiconductor substrate to each other;
    performing heat treatment to divide the single crystal semiconductor substrate along the damaged region and to form a semiconductor layer over the substrate having the insulating surface; and
    irradiating a surface of the semiconductor layer with light from a flash lamp under a condition where the semiconductor layer is not melted, to repair a defect.

9. The method for manufacturing a semiconductor substrate according to claim 8, further comprising the step of performing planarization treatment on the semiconductor layer before or after the irradiation with the light from the flash lamp.

10. The method for manufacturing a semiconductor substrate according to claim 9, wherein the planarization treatment includes etching treatment.

11. The method for manufacturing a semiconductor substrate according to claim 8, wherein a time of irradiation with the light from the flash lamp is 10 µs or more.

12. The method for manufacturing a semiconductor substrate according to claim 8, wherein the light from the flash lamp has a continuous spectrum in a wavelength range from 400 nm to 700 nm.

13. The method for manufacturing a semiconductor substrate according to claim 8, wherein the flash lamp is a xenon lamp.

14. The method for manufacturing a semiconductor substrate according to claim 8, wherein a temperature of the substrate having the insulating surface is kept at 300° C. or higher during the irradiation with the light from the flash lamp.

15. A method for manufacturing a semiconductor substrate, comprising the steps of:
    forming an insulating layer over a surface of a single crystal semiconductor substrate;
    irradiating a surface of the insulating layer with ions to form a damaged region in the single crystal semiconductor substrate;
    disposing a surface of a substrate having an insulating surface and the surface of the insulating layer in contact with each other to bond the substrate having the insulating surface and the single crystal semiconductor substrate to each other;
    performing heat treatment to divide the single crystal semiconductor substrate along the damaged region and to form a semiconductor layer over the substrate having the insulating surface; and
    irradiating a surface of the semiconductor layer with light from a flash lamp under a condition where the semiconductor layer is not melted, to repair a defect.

16. The method for manufacturing a semiconductor substrate according to claim 15, further comprising the step of performing planarization treatment on the semiconductor layer before or after the irradiation with the light from the flash lamp.

17. The method for manufacturing a semiconductor substrate according to claim 16, wherein the planarization treatment includes etching treatment.

18. The method for manufacturing a semiconductor substrate according to claim 15, wherein a time of irradiation with the light from the flash lamp is 10 µs or more.

19. The method for manufacturing a semiconductor substrate according to claim 15, wherein the light from the flash lamp has a continuous spectrum in a wavelength range from 400 nm to 700 nm.

20. The method for manufacturing a semiconductor substrate according to claim 15, wherein the flash lamp is a xenon lamp.

21. The method for manufacturing a semiconductor substrate according to claim 15, wherein a temperature of the substrate having the insulating surface is kept at 300° C. or higher during the irradiation with the light from the flash lamp.

22. A method for manufacturing a semiconductor substrate, comprising the steps of:
forming a first insulating layer over a surface of a single crystal semiconductor substrate;
irradiating a surface of the first insulating layer with ions to form a damaged region in the single crystal semiconductor substrate;
forming a second insulating layer over a surface of a substrate having an insulating surface;
disposing a surface of the second insulating layer and the surface of the first insulating layer in contact with each other to bond the substrate having the insulating surface and the single crystal semiconductor substrate to each other;
performing heat treatment to divide the single crystal semiconductor substrate along the damaged region and to form a semiconductor layer over the substrate having the insulating surface; and
irradiating a surface of the semiconductor layer with light from a flash lamp under a condition where the semiconductor layer is not melted, to repair a defect.

23. The method for manufacturing a semiconductor substrate according to claim 22, further comprising the step of performing planarization treatment on the semiconductor layer before or after the irradiation with the light from the flash lamp.

24. The method for manufacturing a semiconductor substrate according to claim 23, wherein the planarization treatment includes etching treatment.

25. The method for manufacturing a semiconductor substrate according to claim 22, wherein a time of irradiation with the light from the flash lamp is 10 µs or more.

26. The method for manufacturing a semiconductor substrate according to claim 22, wherein the light from the flash lamp has a continuous spectrum in a wavelength range from 400 nm to 700 nm.

27. The method for manufacturing a semiconductor substrate according to claim 22, wherein the flash lamp is a xenon lamp.

28. The method for manufacturing a semiconductor substrate according to claim 22, wherein a temperature of the substrate having the insulating surface is kept at 300° C. or higher during the irradiation with the light from the flash lamp.

* * * * *